United States Patent
Seger, Jr. et al.

(10) Patent No.: US 11,681,323 B2
(45) Date of Patent: Jun. 20, 2023

(54) DATA FORMATTING OF A LOW VOLTAGE DRIVE CIRCUIT DATA COMMUNICATION SYSTEM

(71) Applicant: SigmaSense, LLC., Wilmington, DE (US)

(72) Inventors: Richard Stuart Seger, Jr., Belton, TX (US); Daniel Keith Van Ostrand, Leander, TX (US); Gerald Dale Morrison, Redmond, WA (US); Timothy W. Markisen, Mesa, AZ (US)

(73) Assignee: SigmaSense, LLC., Wilmington, DE (US)

( * ) Notice: Subject to any disclaimer, the term of this patent is extended or adjusted under 35 U.S.C. 154(b) by 0 days.

(21) Appl. No.: 17/653,398

(22) Filed: Mar. 3, 2022

(65) Prior Publication Data
US 2022/0269305 A1    Aug. 25, 2022

Related U.S. Application Data

(63) Continuation of application No. 17/217,822, filed on Mar. 30, 2021, now Pat. No. 11,294,420, which is a
(Continued)

(51) Int. Cl.
*G06F 1/10*    (2006.01)
*H03M 1/12*    (2006.01)
(Continued)

(52) U.S. Cl.
CPC .......... *G06F 1/10* (2013.01); *H03K 19/17784* (2013.01); *H03M 1/1255* (2013.01);
(Continued)

(58) Field of Classification Search
CPC ............ H03K 19/17784; H03M 1/124; H03M 1/1255; H04B 1/0007; H04B 1/0014;
(Continued)

(56) References Cited

U.S. PATENT DOCUMENTS 5,677,692 A    10/1997    Hasegawa
6,218,972 B1    4/2001    Groshong
(Continued)

FOREIGN PATENT DOCUMENTS

KR    102032325 B1    10/2019

OTHER PUBLICATIONS

Baker; How delta-sigma ADCs work. Part 1; Analog Applications Journal; Oct. 1, 2011; 6 pgs.
(Continued)

*Primary Examiner* — Young T. Tse
(74) *Attorney, Agent, or Firm* — Garlick & Markison; Patricia M. Healy

(57) ABSTRACT

A method executable by a low voltage drive circuit (LVDC) includes receiving an analog receive signal, converting the analog receive signal into analog inbound data, converting the analog inbound data into digital inbound data, filtering the digital inbound data to produce filtered digital data, sampling and holding an n-bit digital value of the filtered digital data to produce an n-bit sampled digital data value, adjusting formatting of the n-bit sampled digital data value to produce a formatted digital value, and generating a packet of received digital data from a plurality of formatted digital values.

8 Claims, 32 Drawing Sheets data formating module 200

Related U.S. Application Data continuation of application No. 16/266,953, filed on Feb. 4, 2019, now Pat. No. 11,003,205.

(51) Int. Cl.
  *H04B 1/00* (2006.01)
  *H04B 1/40* (2015.01)
  *H03K 19/17784* (2020.01)

(52) U.S. Cl.
  CPC ......... *H04B 1/0007* (2013.01); *H04B 1/0017* (2013.01); *H04B 1/0042* (2013.01); *H04B 1/40* (2013.01)

(58) Field of Classification Search
  CPC .. H04B 1/0017; H04B 1/0028; H04B 1/0039; H04B 1/0042; H04B 1/38; H04B 1/40; H04L 27/02; H04L 27/06; H04L 27/10; H04L 27/14; H04L 27/18; H04L 27/22; G06F 1/10
  USPC ....... 375/219, 220, 257, 268, 269, 272, 279, 375/323, 329, 334; 329/300, 304, 315, 329/345, 347; 455/73, 76, 88, 205, 339
  See application file for complete search history.

(56) References Cited

U.S. PATENT DOCUMENTS

| | | | |
|---|---|---|---|
| 6,628,261 B1 | 9/2003 | Sato | |
| 6,665,013 B1 | 12/2003 | Fossum et al. | |
| 6,882,228 B2 | 4/2005 | Rofougaran | |
| 7,340,662 B1 | 3/2008 | McElwee | |
| 7,495,589 B1 | 2/2009 | Trifonov | |
| 7,528,755 B2 | 5/2009 | Hammerschmidt | |
| 7,787,843 B2 | 8/2010 | Behzad | |
| 8,031,094 B2 | 10/2011 | Hotelling | |
| 8,089,289 B1 | 1/2012 | Kremin et al. | |
| 8,279,180 B2 | 10/2012 | Hotelling et al. | |
| 8,547,114 B2 | 10/2013 | Kremin | |
| 8,625,726 B2 | 1/2014 | Kuan | |
| 8,928,515 B1 | 1/2015 | Hu | |
| 9,201,547 B2 | 12/2015 | Elias | |
| 9,634,679 B1 | 4/2017 | Stein | |
| 9,686,609 B1 | 6/2017 | O'Connor et al. | |
| 10,684,977 B1 | 6/2020 | Seger | |
| 2007/0026837 A1 | 2/2007 | Bagchi | |
| 2008/0036636 A1 | 2/2008 | Khorram | |
| 2008/0318682 A1* | 12/2008 | Rofougaran | G06F 3/011 463/39 |
| 2009/0117938 A1 | 5/2009 | Georgantas | |
| 2010/0211921 A1 | 8/2010 | Hu et al. | |
| 2012/0091799 A1 | 4/2012 | Rofougaran | |
| 2012/0093039 A1 | 4/2012 | Rofougaran | |
| 2013/0237169 A1 | 9/2013 | Walley | |
| 2013/0278447 A1 | 10/2013 | Kremin | |
| 2016/0188049 A1 | 6/2016 | Yang et al. | |
| 2019/0171331 A1 | 6/2019 | Gray et al. | |

OTHER PUBLICATIONS

Brian Pisani, "Digital Filter Types in Delta-Sigma ADCs", Application Report SBAA230, May 2017, pp. 1-8, Texas Instruments Incorporated, Dallas, Texas.

International Searching Authority; International Search Report and Written Opinion; International Application No. PCT/US2020/016137; dated May 11, 2020; 7 pgs.

International Searching Authority; International Search Report and Written Opinion; International Application No. PCT/US2020/058353; dated Mar. 5, 2021; 7 pgs.

* cited by examiner data communication system 10 data communication system 10 computing device 12 wireless computing device 14

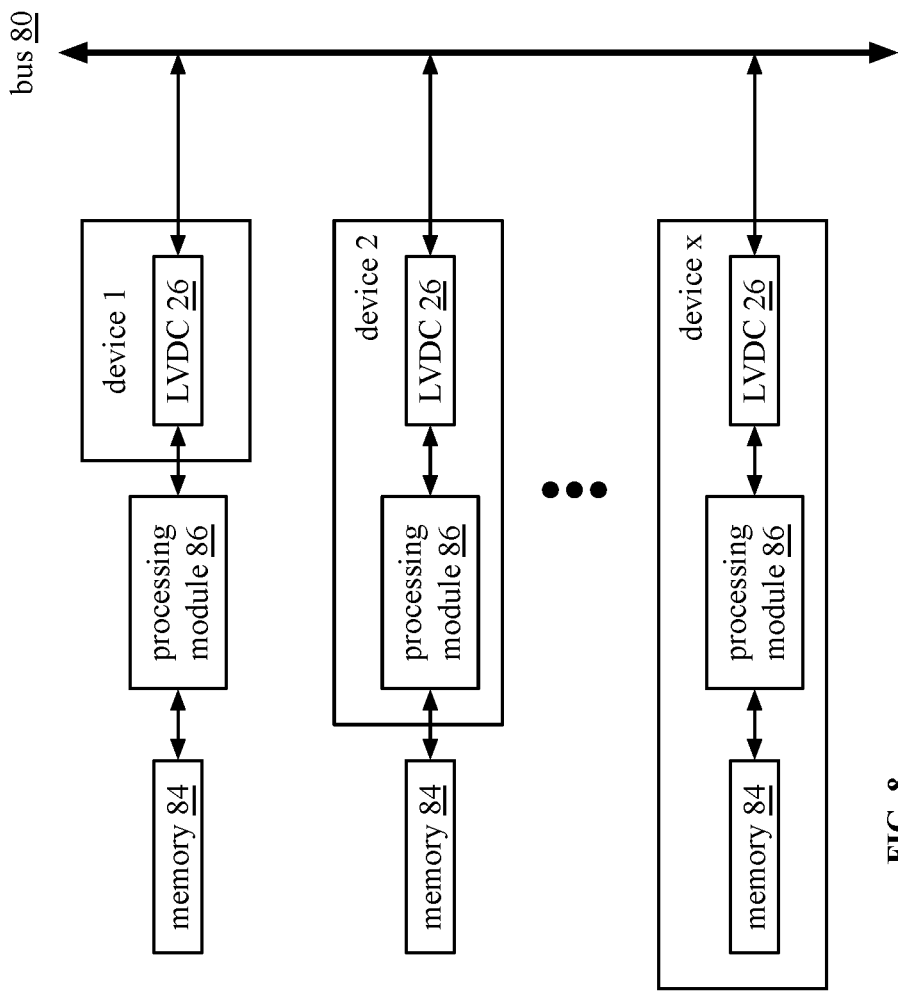

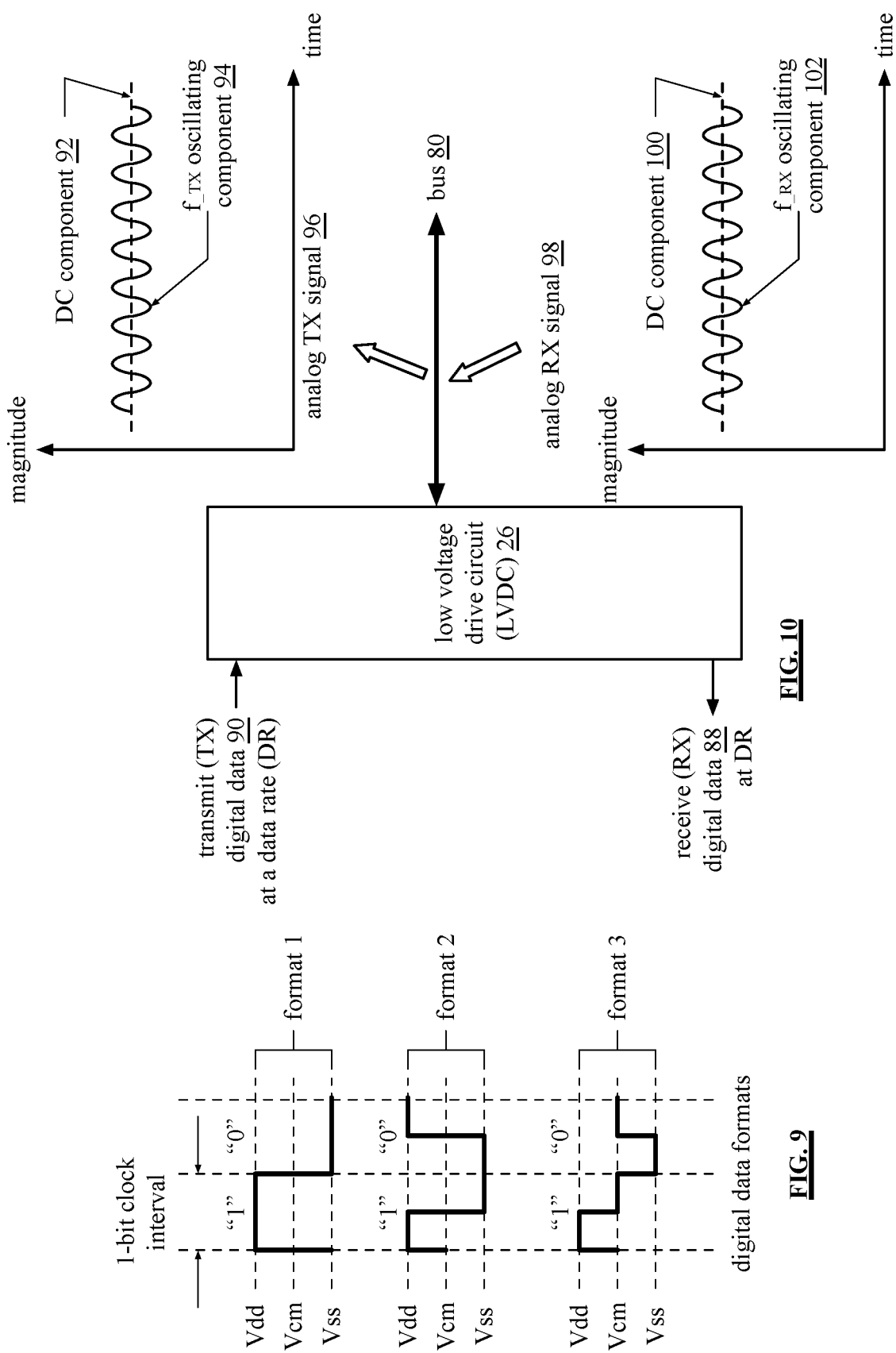

drive-sense circuit 106 drive-sense circuit 106

FIG. 16 LVDC 26 receive analog to digital circuit 108 digital filtering circuit 198 digital filtering circuit 198

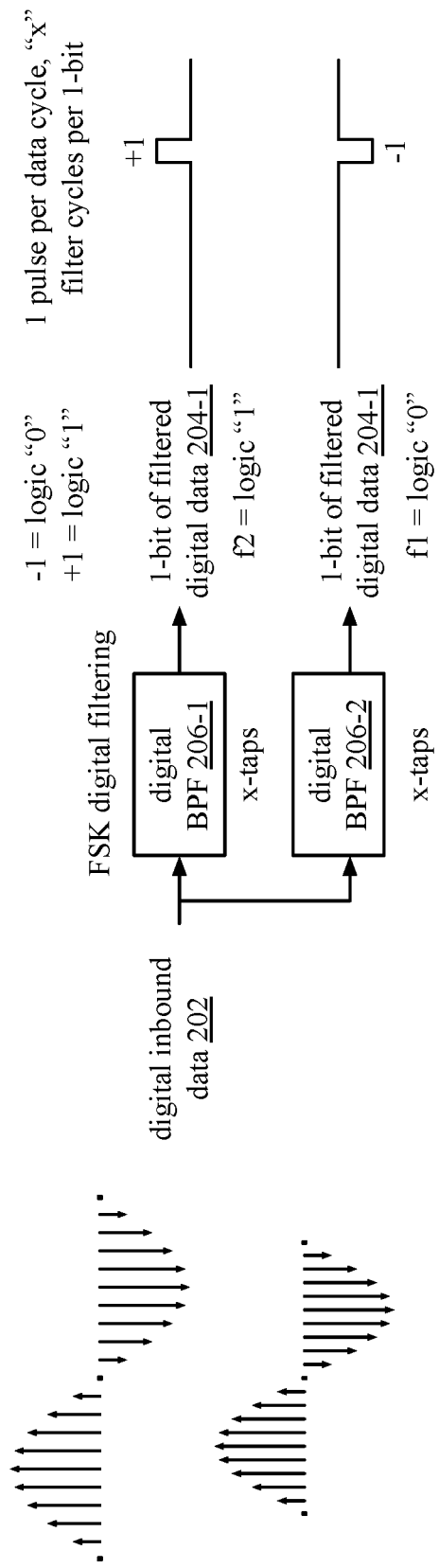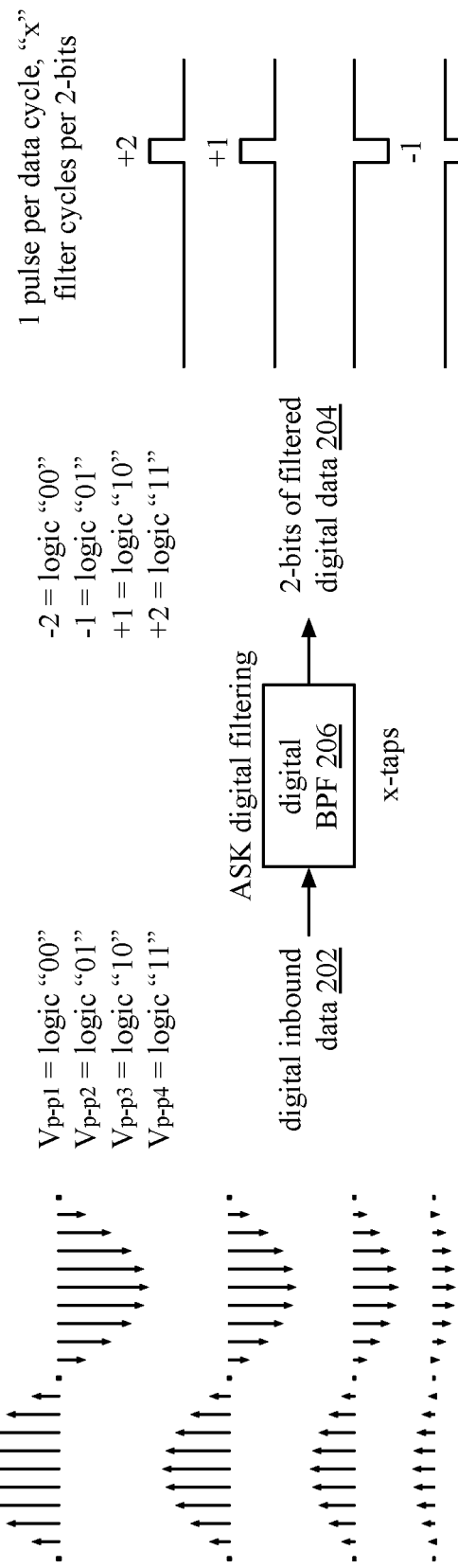

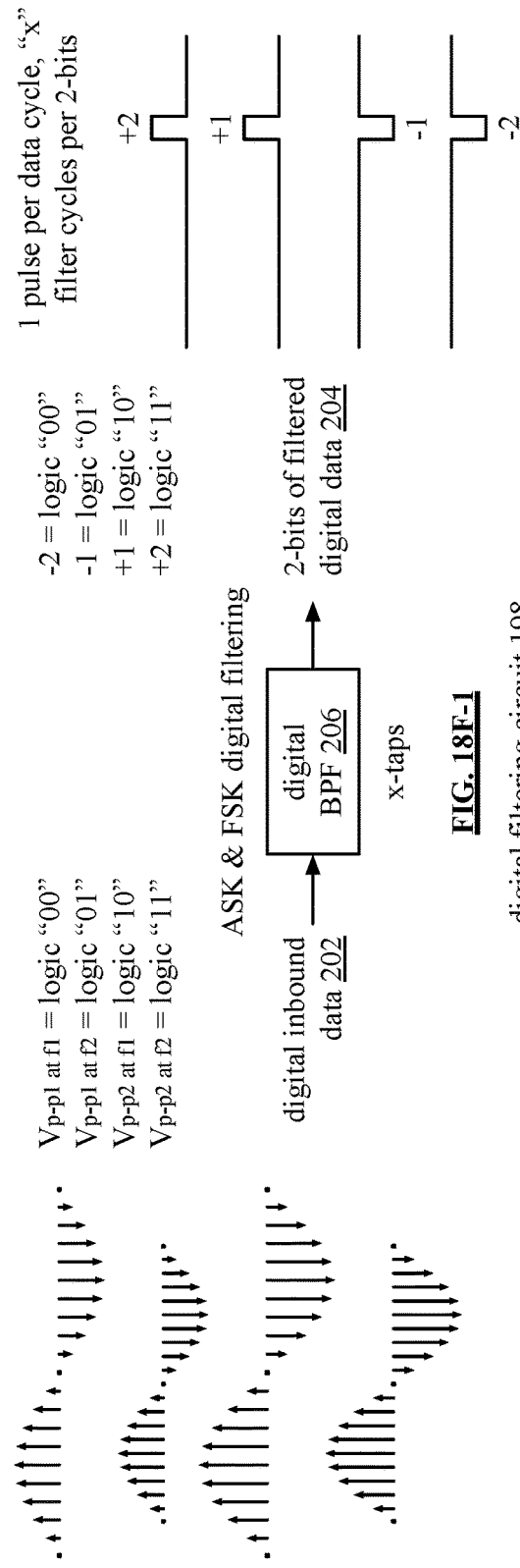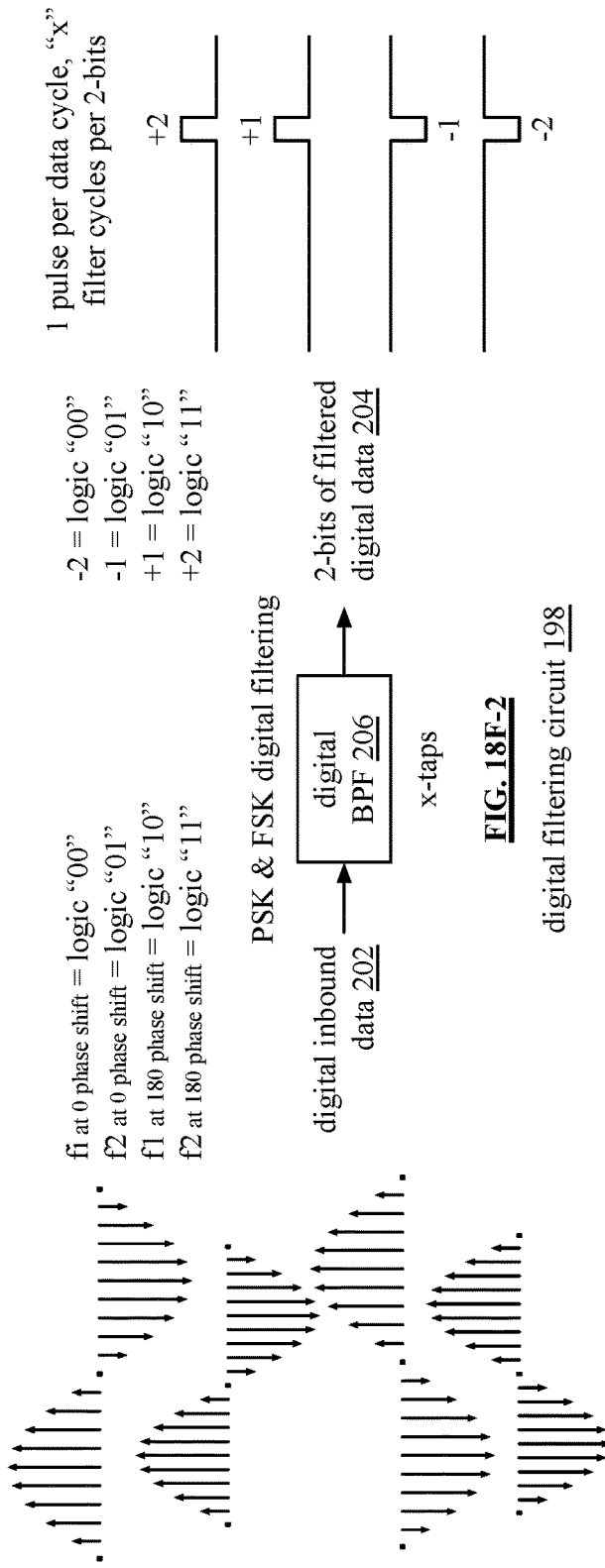
FIG. 18F-1
digital filtering circuit 198
FIG. 18F-2
digital filtering circuit 198

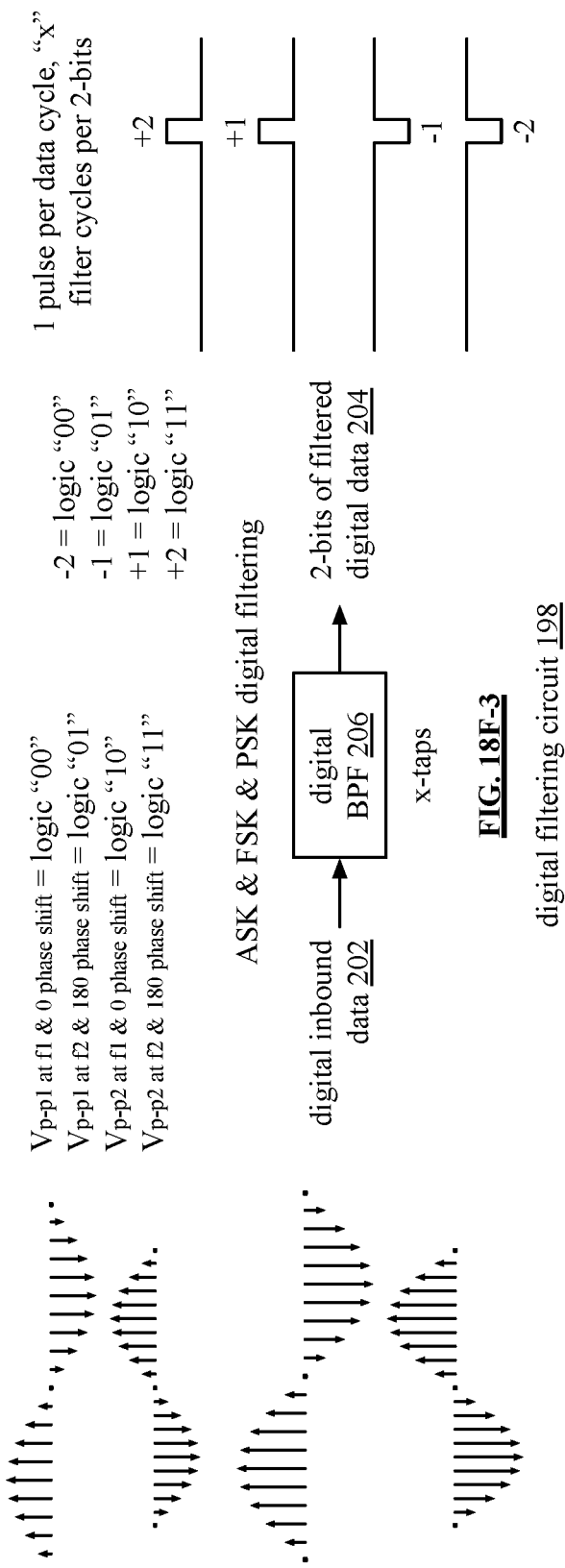

digital BPF 206 data formating module 200 received digital data 88

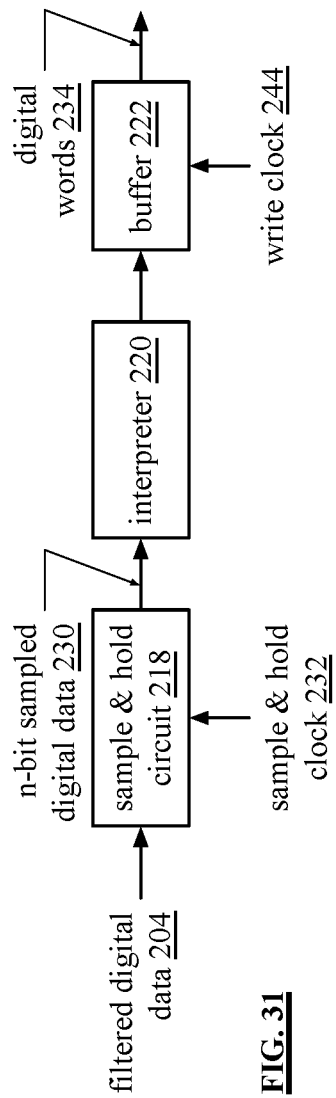
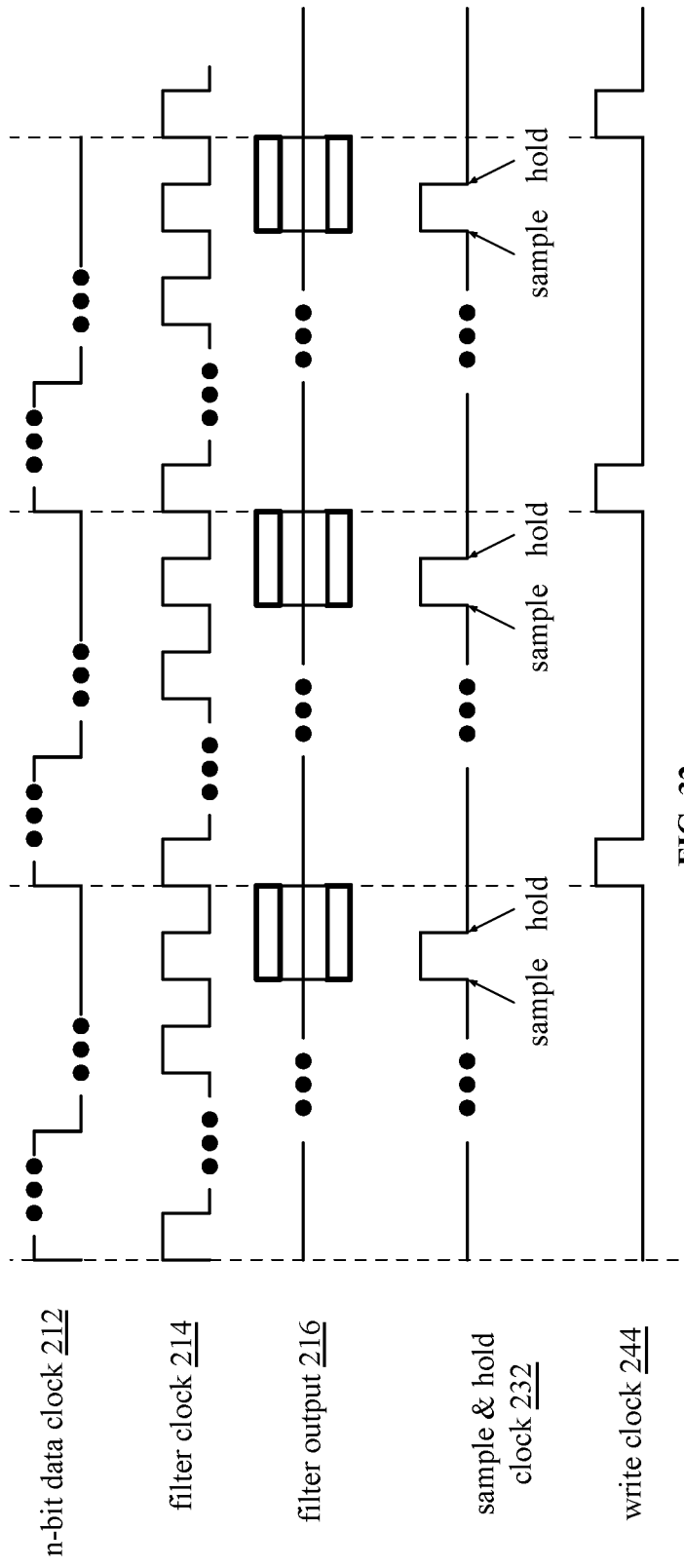

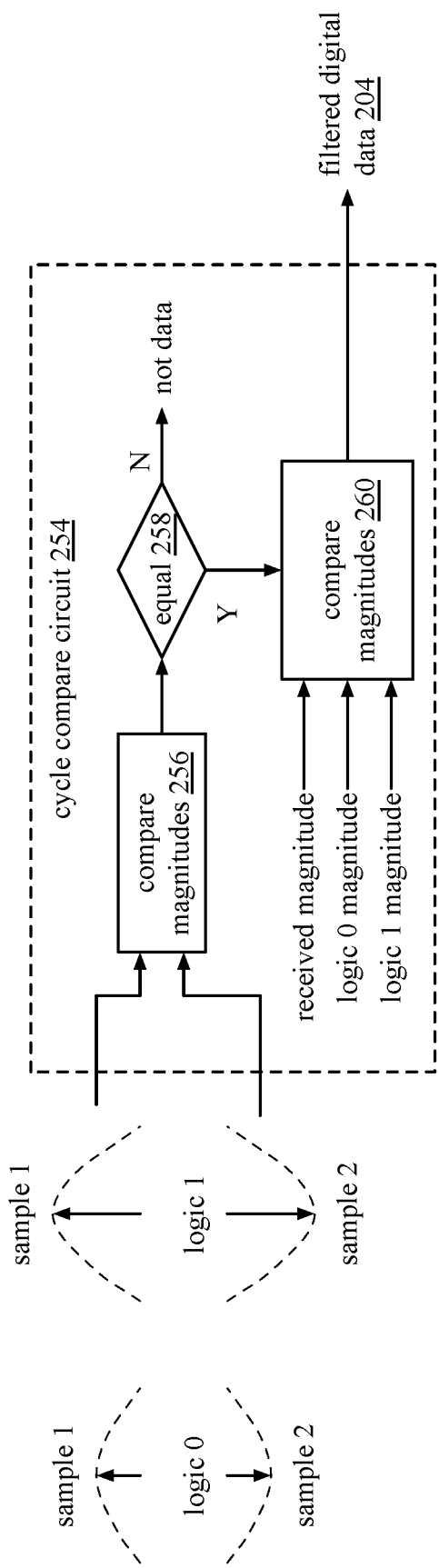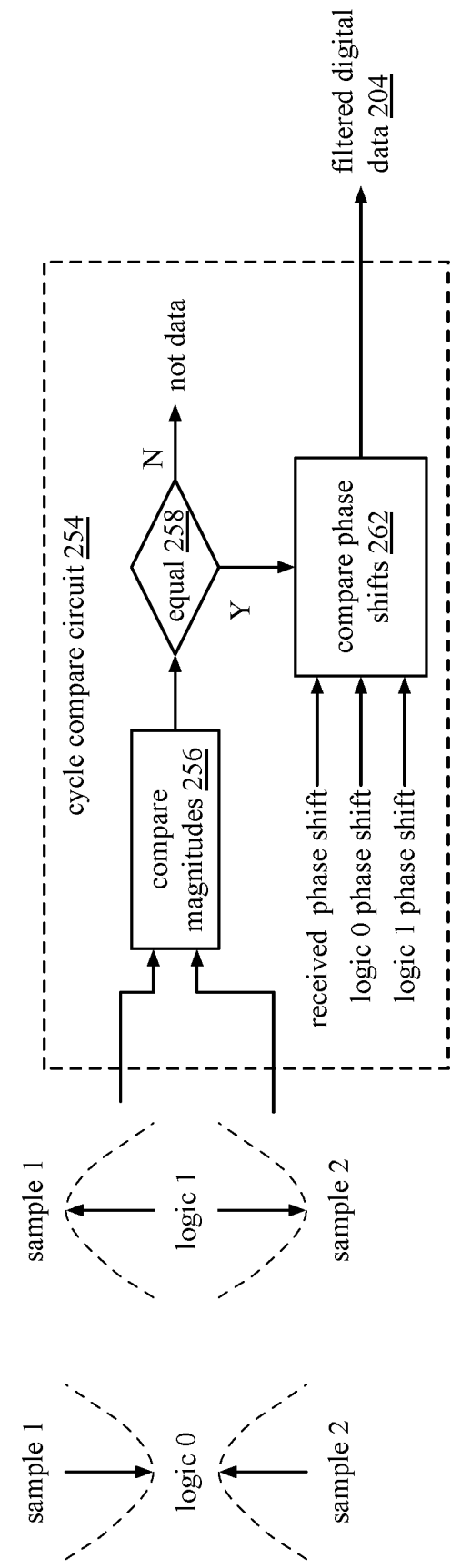

DATA FORMATTING OF A LOW VOLTAGE DRIVE CIRCUIT DATA COMMUNICATION SYSTEM

CROSS-REFERENCE TO RELATED APPLICATIONS

The present U.S. Utility Patent Application claims priority pursuant to 35 U.S.C. § 120 as a continuation of U.S. Utility application Ser. No. 17/217,822, entitled "DATA FORMATTING CIRCUIT OF A LOW VOLTAGE DRIVE CIRCUIT DATA COMMUNICATION SYSTEM," filed Mar. 30, 2021 which claims priority pursuant to 35 U.S.C. § 120 as a continuation of U.S. Utility application Ser. No. 16/266,953, entitled "RECEIVE ANALOG TO DIGITAL CIRCUIT OF A LOW VOLTAGE DRIVE CIRCUIT DATA COMMUNICATION SYSTEM," filed Feb. 4, 2019, issued as U.S. Pat. No. 11,003,205 on May 11, 2021, all of which are hereby incorporated herein by reference in their entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to data communication systems and more particularly to sending and receiving data via a common bus.

Description of Related Art

Data communication involves sending data from one device to another device via a communication medium (e.g., a wire, a trace, a twisted pair, a coaxial cable, air, etc.). The devices range from dies within an integrated circuit (IC), to ICs on a printed circuit board (PCB), to PCBs within a computer, to computers, to networks of computers, and so on.

Data is communicated via a wired and/or a wireless connection and is done so in accordance with a data communication protocol. Data communication protocols dictate how the data is to be formatted, encoded/decoded, transmitted, and received. For example, a wireless data communication protocol such as IEEE 802.11 dictates how wireless communications are to be done via a wireless local area network. As another example, Sony/Philips Digital Interface Format (SPDIF) dictates how digital audio signals are transmitted and received. As yet another example, Inter-Integrated Circuit (I²C) is a two-wire serial protocol to connect devices such as microcontrollers, digital to analog converters, analog to digital converters, peripheral devices to a computer, and so on.

In addition, data communication protocols dictate how transmission errors are to be handled. For example, wireless communications often experience data errors, so the protocol dictates a form of forward error correction (e.g., Reed Solomon encoding, Turbo encoded, etc.) be used. As another example, wired communications experience much less data errors than wireless communications so the protocol dictates a form of feedback error correction (e.g., resend request, etc.) be used.

For some data communications, digital data is modulated with an analog carrier signal and transmitted/received via a modulated radio frequency (RF) signal. For other data communications, the digital data is transmitted "as is" via a wire or metal trace on a PCB. Regardless of the data communication protocol, digital data is in binary form where a logic "1" value is represented by a voltage that is at least 90% of the positive rail voltage and a logic "0" is represented by a voltage it is at most 10% of the negative rail voltage.

BRIEF DESCRIPTION OF THE SEVERAL VIEWS OF THE DRAWING(S)

FIG. 8 is a schematic block diagram of another embodiment of a data communication system in accordance with the present invention;

FIG. 9 is a schematic block diagram of examples of digital data formats;

FIG. 10 is a functional diagram of an embodiment of an LVDC in accordance with the present invention;

FIGS. 18A-18F-3 are schematic block diagrams of embodiments of a digital filtering circuit in accordance with the present invention;

FIG. 31 is a schematic block diagram of an embodiment of a portion of a data formatting module in accordance with the present invention;

FIG. 32 is an example of clock signals of the portion of formatting module of FIG. 31 in accordance with the present invention;

FIG. 37 is a schematic block diagram of an embodiment of a cycle compare circuit in accordance with the present invention; and FIG. 38 is a schematic block diagram of another embodiment of a cycle compare circuit in accordance with the present invention.

DETAILED DESCRIPTION OF THE INVENTION

Figure 1:
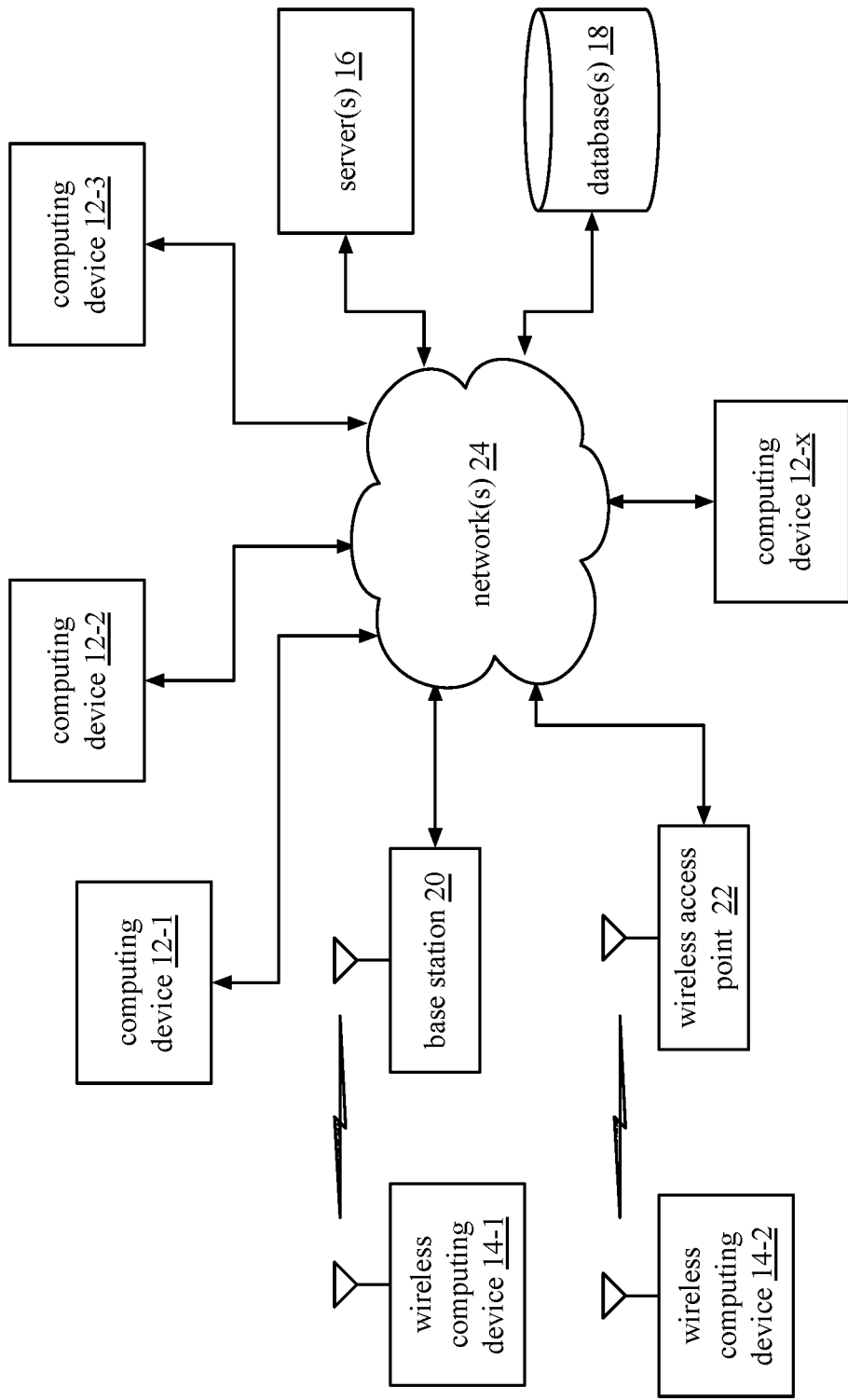
FIG. 1 is a schematic block diagram of an embodiment of a data communication system in accordance with the present invention.

FIG. 1 is a schematic block diagram of an embodiment of a data communication system 10 that includes a plurality of computing devices 12, a plurality of wireless computing devices 14, one or more servers 16, one or more databases 18, one or more networks 24, one or more base stations 20, and/or one or more wireless access points 22. Embodiments of computing devices 12 and 14 are similar in construct and/or functionality with a difference being the computing devices 12 couple to the network(s) 24 via a wired network card and the wireless communication devices 14 coupled to the network(s) via a wireless connection. In an embodiment, a computing device can have both a wired network card and a wireless network card such that it is both computing devices 12 and 14.

A computing device 12 and/or 14 may be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. The computing devices 12 and 14 will be discussed in greater detail with reference to one or more of FIGS. 3-4.

A server 16 is a special type of computing device that is optimized for processing large amounts of data requests in parallel. A server 16 includes similar components to that of the computing devices 12 and/or 14 with more robust processing modules, more main memory, and/or more hard drive memory (e.g., solid state, hard drives, etc.). Further, a server 16 is typically accessed remotely; as such it does not generally include user input devices and/or user output devices. In addition, an embodiment of a server is a standalone separate computing device and/or may be a cloud computing device.

A database 18 is a special type of computing device that is optimized for large scale data storage and retrieval. A database 18 includes similar components to that of the computing devices 12 and/or 14 with more hard drive memory (e.g., solid state, hard drives, etc.) and potentially with more processing modules and/or main memory. Further, a database 18 is typically accessed remotely; as such it does not generally include user input devices and/or user output devices. In addition, an embodiment of a database 18 is a standalone separate computing device and/or may be a cloud computing device.

The network(s) 24 includes one or more local area networks (LAN) and/or one or more wide area networks (WAN), which may be a public network and/or a private network. A LAN may be a wireless-LAN (e.g., Wi-Fi access point, Bluetooth, ZigBee, etc.) and/or a wired LAN (e.g., Firewire, Ethernet, etc.). A WAN may be a wired and/or wireless WAN. For example, a LAN is a personal home or business's wireless network and a WAN is the Internet, cellular telephone infrastructure, and/or satellite communication infrastructure.

The computing devices 12, the wireless communication devices 14, the server 16, the database 18, the base station 20, and/or the wireless access point 22 include one or more low voltage drive circuits (LVDC) for communicating data via a line of a bus (e.g., a bus includes one or more lines, each line is a wired connection, a wire, a trace on a PCB, etc.). The data communication is between devices and/or is within a device. For example, two computing devices communicate with each other via their respective LVDCs. As another example, components within a computing device have associated LVDCs and the components communicate data via the LVDCs.

Figure 2:
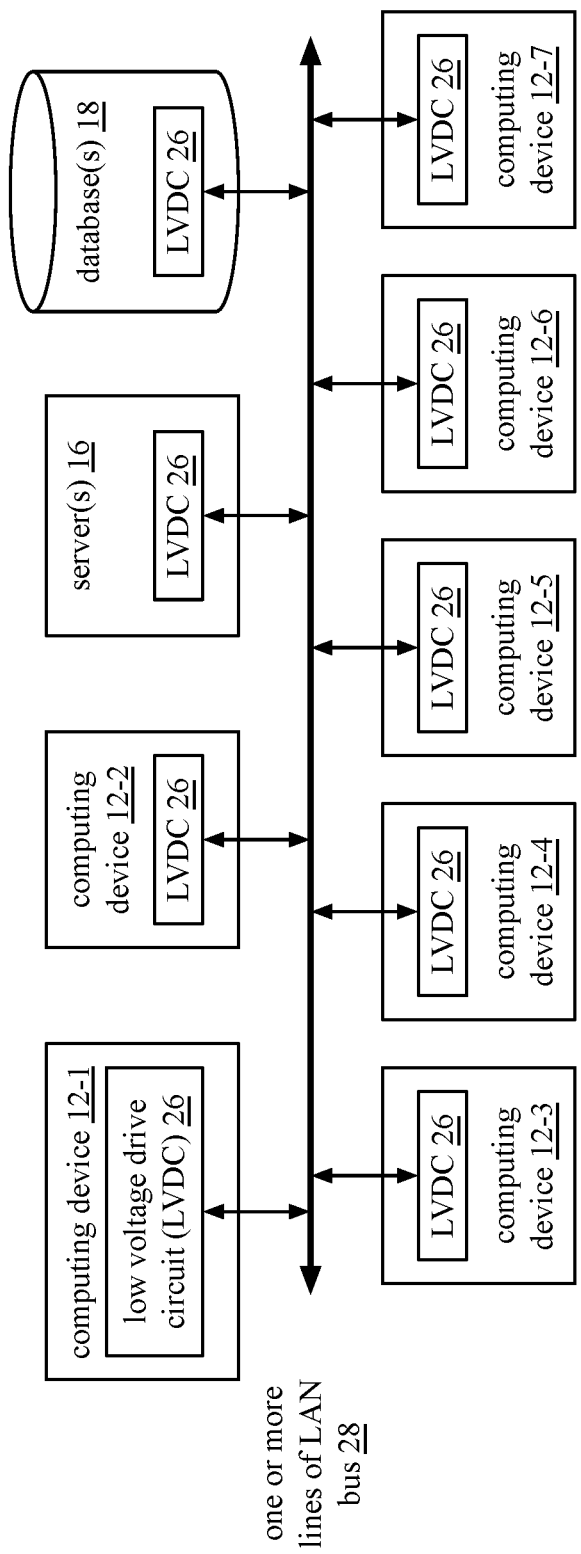
FIG. 2 is a schematic block diagram of another embodiment of a data communication system in accordance with the present invention.

FIG. 2 is a schematic block diagram of another embodiment of a data communication system 10 that includes the computing devices 12, the server 16, and the database 18 coupled to one or more lines of a LAN bus 28. Each device 12, 16, and 18 includes one or more LVDCs 26 for communicating data via the line of the LAN bus 28.

An LVDC 26 functions to convert transmit digital data from its host device into an analog transmit signal. As an example, a host device is a computing device, a server, or a database. As another example, a host device is an interface of one the computing device, the server, or the database. As yet another example, a host device is an integrated circuit of the computing device, the server, or the database. As a further example, a host device is a die of an integrated circuit.

The LVDC 26 produces the analog transmit signal to have an oscillating component at a given frequency that represents the transmit digital data and to have a very low magnitude. For example, the magnitude of the oscillating component is between five percent and 75 percent of the rail to rail voltage (or current) of the LVDC (e.g., Vdd-Vss of the LVDC). By keeping the magnitude of the oscillating component very low with respect to the rail to rail voltage (or current), data is transmitted with very low power and very good noise immunity. As a specific example, if the voltage magnitude of the oscillating component is 25 mV (milli-volts) and the current is 0.1 mA (milli-amps), then the power is 2.5 µW (micro-watts).

The LVDC 26 also functions to convert an analog receive signal into received digital data that is provided to its host. The analog receive signal is an analog transmit signal from another LVDC of the same host or a different host and is received from the same line of the bus as which the LVDC transmits its analog transmit signal. For an LVDC, the analog receive signal is at the same frequency as its analog transmit signal for half duplex communication and is at a different frequency for full duplex communication.

An LVDC 26 is capable of communicating data with one or more other LVDCs using a plurality of frequencies. Each frequency supports a conveyance of data. For example, the transmit digital data can be divided up into data streams, where each data stream is transmitted on a different frequency of the analog transmit signal. This increases the data rate per line of the bus with very little increase in power. One or more other LVDCs can receive the multiple frequencies of the analog transmit signal, recover the data streams, and recover the transmitted digital data.

Figure 3:
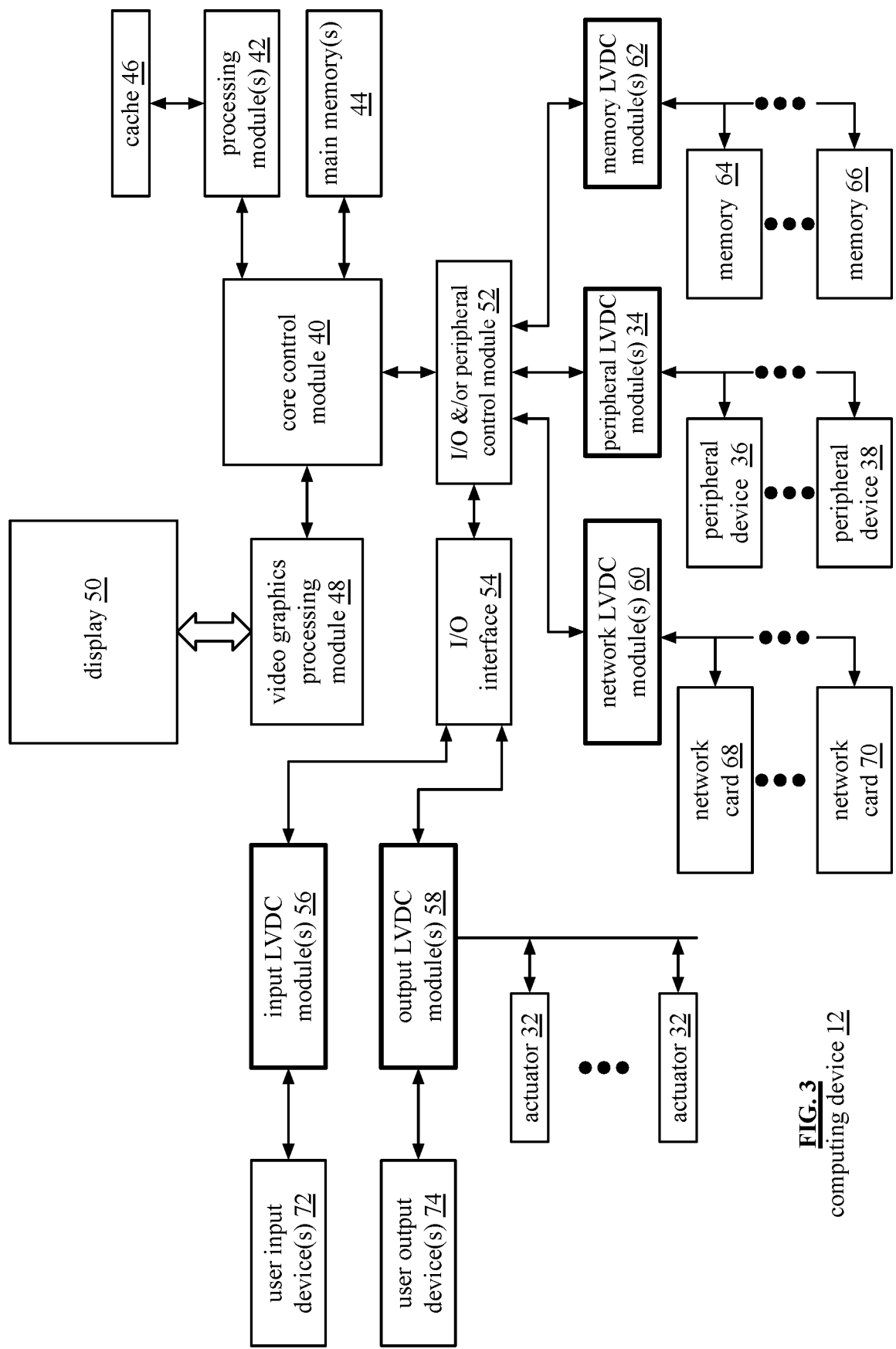
FIG. 3 is a schematic block diagram of an embodiment of a computing device in accordance with the present invention.

FIG. 3 is a schematic block diagram of an embodiment of a computing device 12 that includes a core control module 40, one or more processing modules 42, one or more main memories 44 (e.g., volatile memory), cache memory 46, a video graphics processing module 48, a display 50, an Input-Output (I/O) and/or peripheral control module 52, one or more input LVDC modules 56, one or more output LVDC modules 58, one or more network LVDC modules 60, one or more peripheral LVDC modules 34, and one or more memory LVDC modules 62. A processing module 42 is described in greater detail at the end of the detailed description of the invention section and, in an alternative embodiment, has a direct connection to the main memory 44. In an alternate embodiment, the core control module 40 and the I/O and/or peripheral control module 52 are one module, such as a chipset, a quick path interconnect (QPI), and/or an ultra-path interconnect (UPI).

Each of the main memories 44 includes one or more Random Access Memory (RAM) integrated circuits, or chips. For example, a main memory 44 includes four DDR4 ($4^{th}$ generation of double data rate) RAM chips, each running at a rate of 2,400 MHz. In general, the main memory 44 stores data and operational instructions most relevant for the processing module 42. For example, the core control module 40 coordinates the transfer of data and/or operational instructions from the main memory 44 and the memory 64-66. The data and/or operational instructions retrieved from memory 64-66 are the data and/or operational instructions requested by the processing module or will most likely be needed by the processing module. When the processing module is done with the data and/or operational instructions in main memory, the core control module 40 coordinates sending updated data to the memory 64-66 for storage.

The memory 64-66 (i.e., non-volatile memory) includes one or more hard drives, one or more solid state memory chips, and/or one or more other large capacity storage devices that, in comparison to cache memory and main memory devices, is/are relatively inexpensive with respect to cost per amount of data stored. The memory 64-66, which includes an LVDC, is coupled to the core control module 40 via the I/O and/or peripheral control module 52 and via one or more memory LVDC modules 62. In an embodiment, the I/O and/or peripheral control module 52 includes one or more Peripheral Component Interface (PCI) buses to which peripheral components connect to the core control module 40. A memory LVDC module 62 includes a software driver and hardware as discussed in one or more subsequent Figures.

The core control module 40 coordinates data communications between the processing module(s) 42 and the network(s) 24 via the I/O and/or peripheral control module 52, the network LVDC module(s) 60, and a network card 68 or 70. A network card 68 or 70 includes an LVDC and a wired communication unit. A wired communication unit includes a Gigabit LAN connection, a Firewire connection, and/or a proprietary computer wired connection. A network LVDC module 60 includes a software driver and hardware as discussed in one or more subsequent Figures.

The core control module 40 coordinates data communications between the processing module(s) 42 and the user input device(s) 72 via the input LVDC module(s) 56 and the I/O and/or peripheral control module 52. A user input device 72 includes an LVDC and further includes one or more of a keypad, a keyboard, control switches, a touchpad, a microphone, a camera, etc. An input LVDC module 56 includes a software driver and hardware as discussed in one or more subsequent Figures.

The core control module 40 coordinates data communications between the processing module(s) 42 and the user output device(s) 74 via the output LVDC module(s) 58 and the I/O and/or peripheral control module 52. A user output device 74 includes an LVDC and a speaker, a tactile actuator, etc. An output LVDC module 58 includes a software driver and hardware as discussed in one or more subsequent Figures.

The core control module 40 coordinates data communications between the processing module(s) 42 and peripheral devices 36 and 38 via the I/O and/or peripheral control module 52 and the peripheral LVDC module(s) 34. A peripheral device 36 or 38 includes an external hard drive, a headset, a speaker, a microphone, a thumb drive, a camera, etc. A peripheral LVDC module 34 includes a software driver and hardware as discussed in one or more subsequent Figures.

The core control module 40 communicates directly with a video graphics processing module 48 to display data on the display 50. The display 50 includes an LED (light emitting diode) display, an LCD (liquid crystal display), and/or other type of display technology. The display has a resolution, an aspect ratio, and other features that affect the quality of the display. The video graphics processing module 48 receives data from the processing module 42, processes the data to produce rendered data in accordance with the characteristics of the display, and provides the rendered data to the display 50. While not shown, the computing device 12 further includes a BIOS (Basic Input Output System) memory coupled to the core control module 40.

Figure 4:
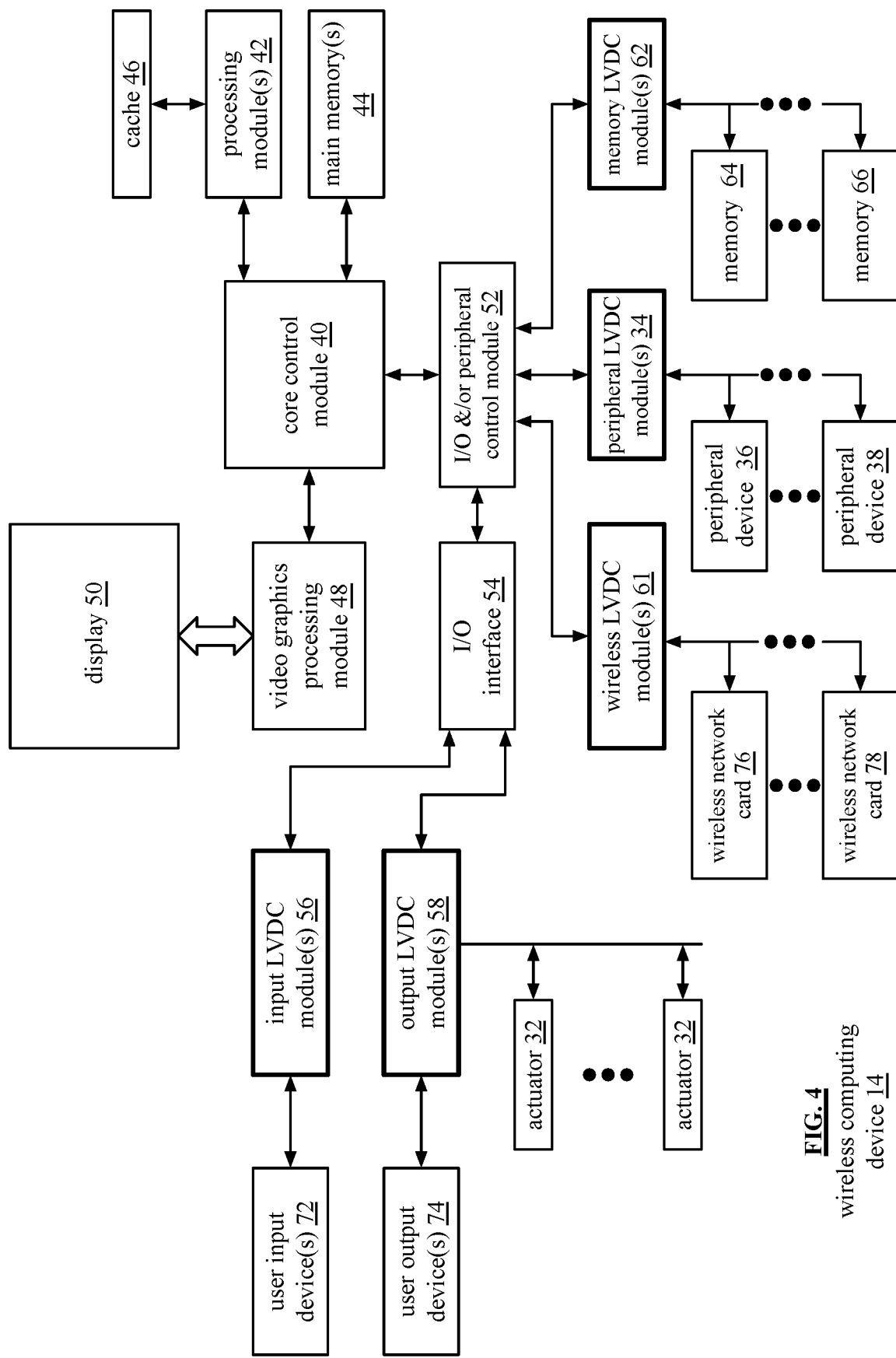
FIG. 4 is a schematic block diagram of an embodiment of a wireless computing device in accordance with the present invention.

FIG. 4 is a schematic block diagram of an embodiment of a wireless computing device 14 that includes a core control module 40, one or more processing modules 42, one or more main memories 44 (e.g., volatile memory), cache memory 46, a video graphics processing module 48, a display 50, an Input-Output (I/O) and/or peripheral control module 52, one or more input LVDC modules 56, one or more output LVDC modules 58, one or more wireless network LVDC modules 61, and one or more memory LVDC modules 62. The common components of the wireless computing device 14 and the computing device 12 function as discussed with reference to FIG. 3. In this embodiment, communication with the network 24 is done wirelessly.

In particular, the core control module 40 coordinates data communications between the processing module(s) 42 and network(s) 24 wirelessly via the I/O and/or peripheral control module 52, the wireless network LVDC module(s) 61, and a wireless network card 76 or 78. A wireless network card 76 or 78 includes an LVDC and a wireless communication unit. A wireless communication unit includes a wireless local area network (WLAN) communication device, a cellular communication device, a Bluetooth device, and/or a ZigBee communication device. A wireless network interface module 61 includes a software driver and hardware as discussed in one or more subsequent Figures.

Figure 5:
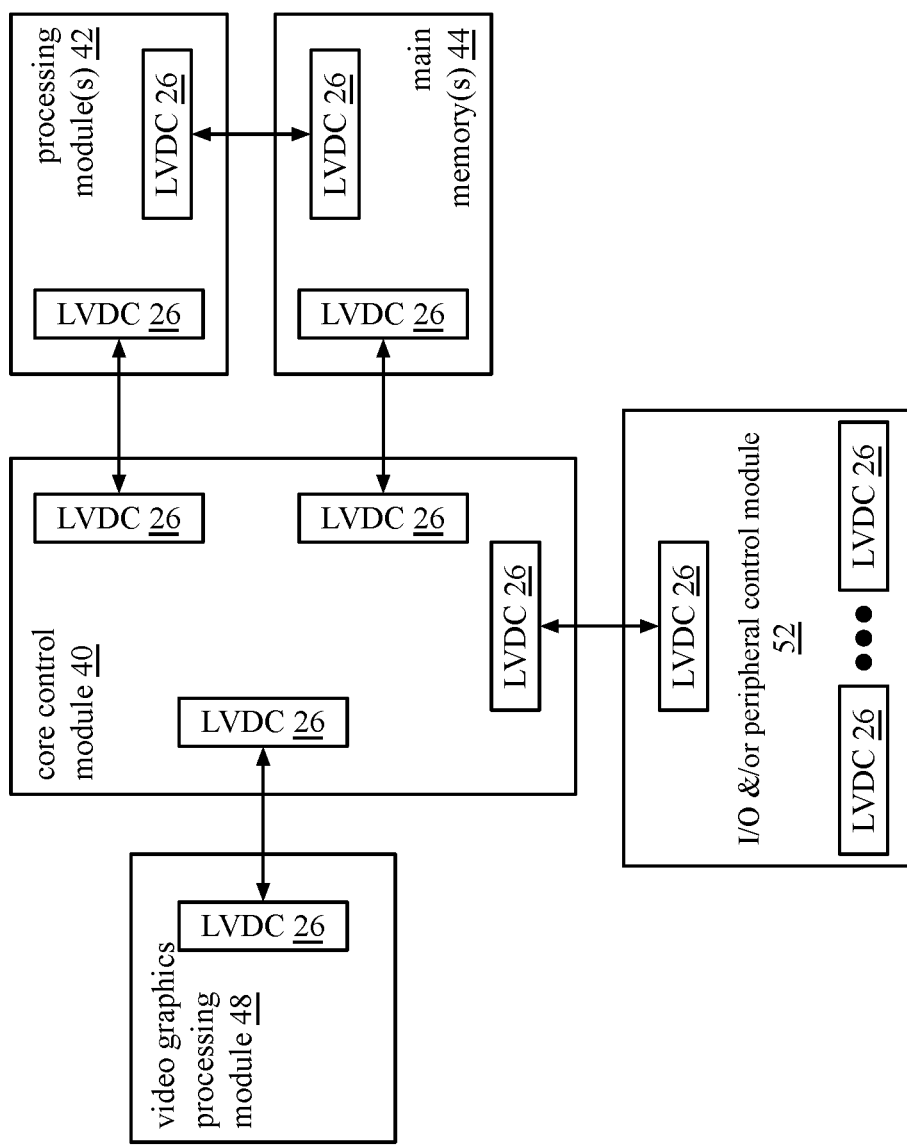
FIG. 5 is a schematic block diagram of an embodiment of a computing core of a computing device in accordance with the present invention.

FIG. 5 is a schematic block diagram of an embodiment of a computing core of a computing device 12 or 14. The computing core includes the core control module 40, the processing module(s) 42, the main memory 44, the video graphics processing module 48, and the IO and/or peripheral control module 52. These components are generally implemented as integrated circuits (ICs) and mounted on a mother board. The mother board includes traces that form buses for data to be communicated between the components.

In this embodiment, the data communication between components 40-52 is done via Low Voltage Drive Circuits (LVDCs). Each component 40-52 includes one or more LVDCs for communicating with one or more other components. For example, the core control module 40 includes four LVDCs: A first LVDC for one-to-one communication with the processing module 42; a second LVDC for one-to-one communication with the main memory 44; a third LVDC for one-to-one communication with the video graphics processing module 48; and a fourth LVDC for one-to-one communication with the IO and/or peripheral control module 52.

In this embodiment, the core control module 40 is coupled to the processing module 42 via a single trace for data communication there-between. The core control module 40 is also coupled, via a single trace, to the main memory 44, the video graphics processing module 48, and to the IO and/or peripheral control module 52. Similarly, the processing module 42 is coupled to the main memory via a single trace. In this manner, the number of traces on the mother board is substantially reduced in comparison to mother boards that use conventional data communication between the components. In addition, the power to convey data is substantially reduced in the present embodiment in comparison to mother boards that use conventional data communication.

In an alternate embodiment, each of the core control module 40, the processing module(s) 42, the main memory 44, the video graphics processing module 48, and the IO and/or peripheral control module 52 includes one LVDC that is coupled to one or more lines of a bus. In an example, the core control module 40 communicates with the processing module 42 using a first set of channels of a frequency band; communicates with main memory 44 using a second set of channels of the frequency band; communicates with the video graphics processing module 48 using a third set of channels of the frequency band; and communicates with the IO and/or peripheral control module 52 using a fourth set of channels of the frequency band. As an example, the frequency band ranges from 1.000 GHz to 1.100 GHz with channels at frequencies every 10 MHz. As such, there are 11 channels: the first at 1.000 GHz, the second at 1.010 GHz, and so on through the eleventh at 1.100 GHz. A specific channel includes a sinusoidal signal at a particular frequency within the frequency band.

In another example of alternative embodiment, the channels are allocated to the components on an as needed basis. For example, when the main memory has data to write to memory device(s) via the IO and/or peripheral control module 52, one or more channels are allocated for this communication. When the data has been conveyed, the allocated channels are released for reallocation to another communication.

Figure 6:
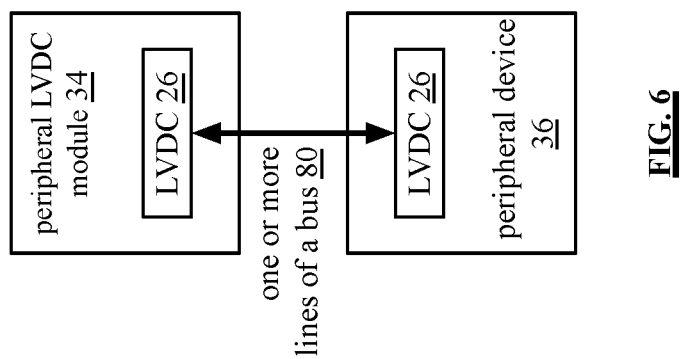
FIG. 6 is a schematic block diagram of an embodiment of a peripheral Low Voltage Drive Circuit (LVDC) module of a computing device coupled to a peripheral device in accordance with the present invention.

FIG. 6 is a schematic block diagram of an embodiment of a peripheral Low Voltage Drive Circuit (LVDC) module 34 of a computing device 12 coupled to a peripheral device 36 via LVDCs 26. The LVDCs are coupled together via one or more lines of a bus 80. The devices communicate data in a full duplex mode per line using multiple channels or in a half duplex mode per line using a single channel. For example, the LVDC of peripheral LVDC module 34 uses channels 1-3 (e.g., frequencies 1-3 of the frequency band) to transmit data to the LVDC of the peripheral device 36. In addition, the LVDC of the peripheral device 36 uses channels 4-6 (e.g., frequencies 4-6 of the frequency band) to transmit data to the LVDC of the peripheral LVDC module 34.

Figure 7:
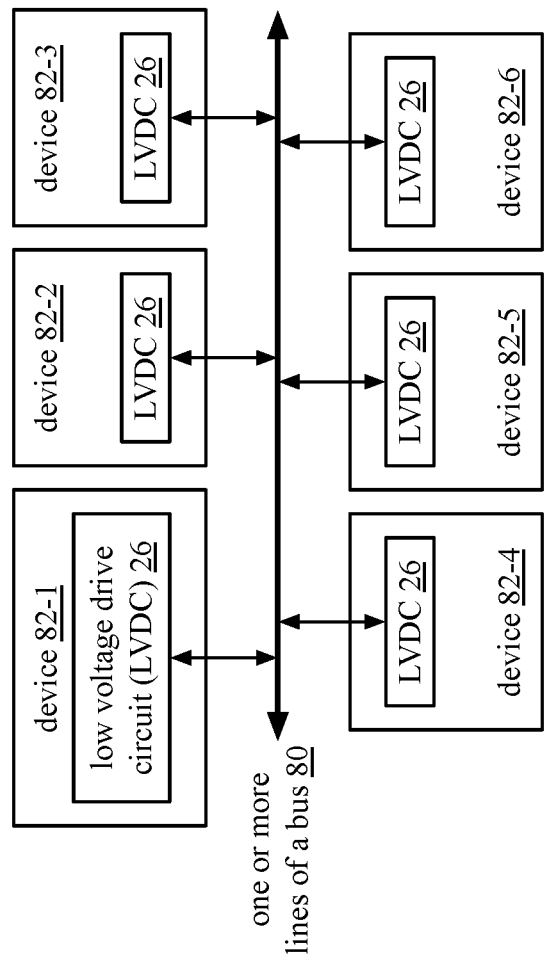
FIG. 7 is a schematic block diagram of another embodiment of a data communication system in accordance with the present invention.

FIG. 7 is a schematic block diagram of another embodiment of a data communication system that includes a plurality of devices 82-1 through 82-6. Each of the devices includes a Low Voltage Drive Circuit (LVDC) 26 coupled to one or more lines of a bus 80. The devices are one or more devices from a list that includes a die of an integrated circuit (IC), an integrated circuit (IC), a printed circuit board with components mounted thereon, and a sub-system of a plurality of printed circuit boards.

The devices communicate with each other via their respective LVDCs and the one or more lines of the bus. For each line of the bus, the LVDCs are assigned (e.g., permanently, on an as needed basis, etc.) channels to transmit data to one or more other devices. An LVDC of a device is tuned to the channel(s) of another device to receive the data transmissions from the other device.

FIG. 8 is a schematic block diagram of another embodiment of a data communication system that includes a plurality of devices 1-x. Each of the devices includes a Low Voltage Drive Circuit (LVDC) 26 coupled to one or more lines of a bus 80. The types of devices vary. For example, device 1 is an interface device that includes a limited amount of additional circuitry beyond the LVDC 26. In particular, device 1 does not include a processing module 86 or memory 84 (e.g., volatile or non-volatile memory). Device 1 is coupled to the processing module 86 of a next level higher component of a computing device. The processing module 86 coupled to device 1 is also coupled to memory 84.

Device 2 includes the LVDC and the processing module 86. The memory 84, however, is associated with the next higher component of the computing device. Device x includes the LVDC, the processing module 86, and the memory 84. As an example, the bus 84 is a backplane of server; device 1 is an interface for a thumb drive; device 2 is a video graphics card, and device x is a mother board. Regardless of the specific implementation of a device including an LVDC, a driver for the LVDC is stored in the memory 84.

FIG. 9 is a schematic block diagram of examples of digital data formats. As known, digital data is a string of binary values. A binary value is either a logic "1" or a logic "0". One binary value corresponds to a bit of the digital data. How the bits are organized into data words establishes the meaning for the data words. For example, American Standard Code for Information Interchange (ASCII) defines characters using 8-bits of data. For example, a capital "A" is represented as the binary value of 0100 0001 and a lower case "a" is represented as the binary value of 0110 0001.

A binary value can be expressed in a variety of forms. In a first example format, a logic "1" is expressed as a positive rail voltage for the duration of a 1-bit clock interval and logic "0" is expressed as a negative rail voltage for the duration of the 1-bit clock interval; or vice versa. The positive rail voltage refers to a positive supply voltage (e.g., Vdd) that is provided to a digital circuit (e.g., a circuit that processes and/or communicates digital data as binary values), the negative rail voltage refers to a negative supply voltage or ground (e.g., Vss) that is provided to the digital circuit, and the common mode voltage (e.g., Vcm) is half way between Vdd and Vss. The 1-bit clock interval corresponds to the inverse of a 1-bit data rate. For example, if the 1-bit data rate is 1 Giga-bit per second (Gbps), then the 1-bit clock interval is 1 nano-second).

In a second example format, a logic "1" is expressed as a non-return to zero waveform that, for the first half of the 1-bit interval, is at the positive rail voltage (Vdd) and for the second half of the 1-bit interval is at the negative rail voltage (Vss). A logic "0" is expressed as a non-return to zero waveform that, for the first half of the 1-bit interval, is at the negative rail voltage (Vss) and for the second half of the 1-bit interval is at the positive rail voltage (Vdd). Alternatively, a logic "0" is expressed as a non-return to zero waveform that, for the first half of the 1-bit interval, is at the positive rail voltage (Vdd) and for the second half of the 1-bit interval is at the negative rail voltage (Vss). A logic "1" is expressed as a non-return to zero waveform that, for the first half of the 1-bit interval, is at the negative rail voltage (Vss) and for the second half of the 1-bit interval is at the positive rail voltage (Vdd).

In a third example format, a logic "1" is expressed as a return to zero waveform that, for the first half of the 1-bit interval, is at the positive rail voltage (Vdd) and for the second half of the 1-bit interval is at the common mode voltage (Vcm). A logic "0" is expressed as a return to zero waveform that, for the first half of the 1-bit interval, is at the negative rail voltage (Vss) and for the second half of the 1-bit interval is at the common mode voltage (Vcm). Alternatively, a logic "0" is expressed as a return to zero waveform that, for the first half of the 1-bit interval, is at the positive rail voltage (Vdd) and for the second half of the 1-bit interval is at the common mode voltage (Vcm). A logic "1" is expressed as a return to zero waveform that, for the first half of the 1-bit interval, is at the negative rail voltage (Vss) and for the second half of the 1-bit interval is at the common mode voltage (Vcm).

With any of the digital data formats, a logic value needs to be within 10% of a respective rail voltage to be considered in a steady data binary condition. For example, for format 1, a logic 1 is not assured until the voltage is at least 90% of the positive rail voltage (Vdd). As another example, for format 1, a logic 0 is not assured until the voltage is at most 10% of the negative rail voltage (Vss).

FIG. 10 is a functional diagram of an embodiment of a Low Voltage Drive Circuit (LVDC) 26. In general, the LVDC 26 functions to convert transmit (TX) digital data 90 into an analog transmit signal 96 and to convert an analog receive signal 98 into receive (RX) digital data 88. The LVDC 26 receives the transmit digital data 90 from its host device and transmits the analog TX signal 96 to another LVDC coupled to the line of the bus 80. The analog transmit signal 96 includes a DC component 92 and an oscillating component 94. The oscillating component 94 includes data encoded into one or more channels of a frequency band and has a very low magnitude (e.g., 5% to 75% of the rail to rail voltage and/or current powering the LVDC and/or the host device). This allows for low power high data rate communications in comparison to conventional low voltage signaling protocols.

As an example, the transmit digital data is encoded into one channel, as such the oscillating component includes one frequency: the one corresponding to the channel. As another example, the transmit digital data is divided into x number of data streams. The LVDC encodes the x number of data streams on to x number of channels. Thus, the oscillating component 94 includes x number of frequencies corresponding to the x number of channels.

The LVDC 26 receives the analog receive signal 98 from another LVDC (e.g., the one it sent its analog TX signal to and/or another LVDC coupled to the line of the bus 80). The analog receive signal 98 includes a DC component 100 and a receive oscillating component 102. The receive oscillating component 102 includes data encoded into one or more channels of a frequency band by the other LVDC and has a very low magnitude. The LVDC converts the analog receive signal 98 into the receive digital data 88, which it provides to its host device.

Figure 11:
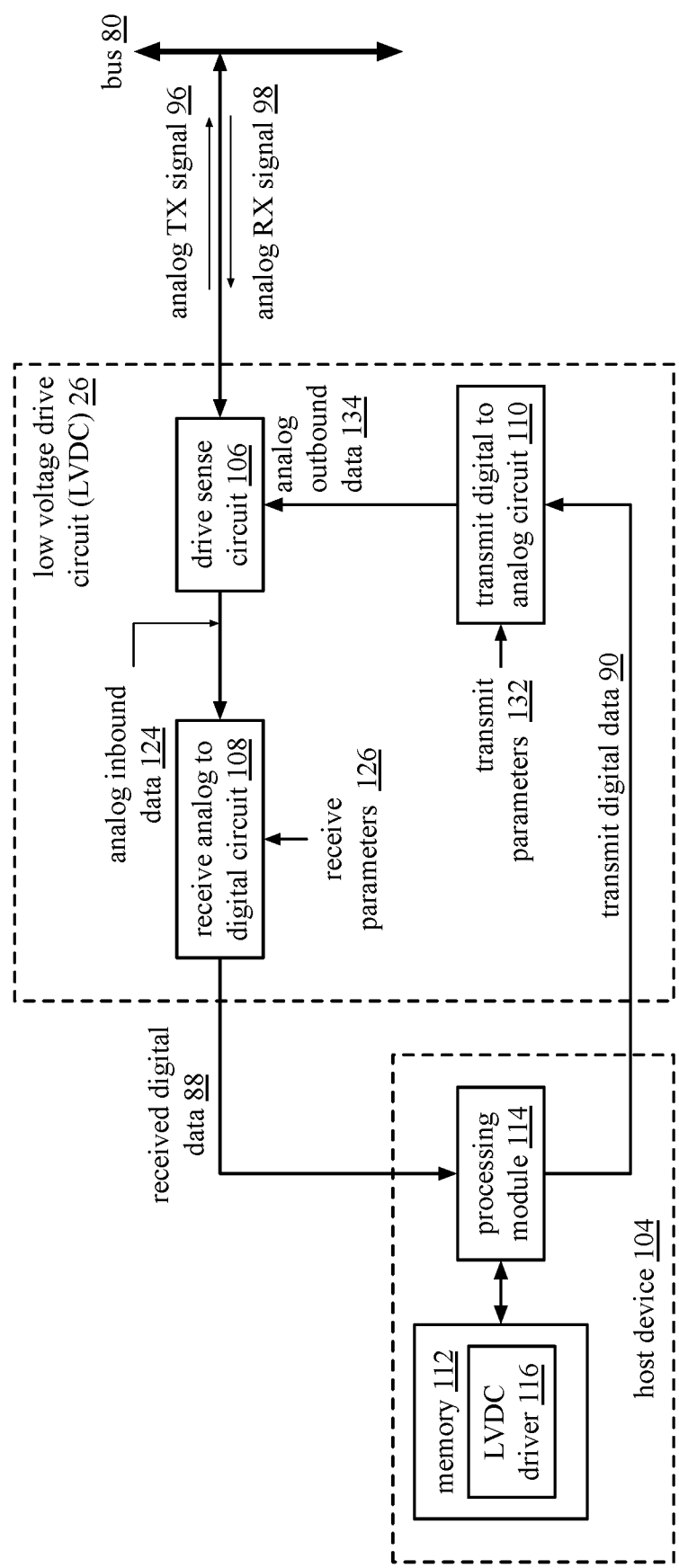
FIG. 11 is a schematic block diagram of an embodiment of an LVDC coupled to a host device in accordance with the present invention.

FIG. 11 is a schematic block diagram of an embodiment of a Low Voltage Drive Circuit (LVDC) 26 coupled to a host device 104 and to one or more lines of a bus 80. The host device 104 includes a processing module 114 and memory 112 (e.g., volatile memory and/or non-volatile memory). The memory 112 stores at least part of an LVDC driver 116 application. The LVDC 26 includes a drive sense circuit 106, a receive analog to digital converter (ADC) circuit 108, and a transmit digital to analog converter (DAC) circuit 110.

In an example of operation, the processing module 104 of the host device 104 accesses the LVDC driver 116 to set up the LVDC 26 for operation. For example, the LVDC driver 116 includes operational instructions and parameters that enable the host device 104 to effectively use the LVDC for data communications. For example, the parameters include two or more of: one or more communication scheme parameters; one or more data conveyance scheme parameters, one or more receive parameters, and one or more transmit parameters. A communication scheme parameter is one of: independent communication (e.g., push data to other device without prompting from other device); dependent communication (e.g., push or pull data to or from other device with coordination between the devices); one to one communication; one to many communication; many to one communication; many to many communication; half duplex communication; and full duplex communication.

A data conveyance scheme parameter is one of: a data rate per line; a number of bits per data rate interval; data coding scheme per line and per number of bits per data rate interval; direct data communication; modulated data communication; power level of signaling per line of the bus; voltage/current level for a data coding scheme per line (e.g., function of signal to noise ratio, power level, and data rate); number of lines in the bus; and a number of lines of the bus to use.

A receive parameter includes one of: a digital data format for the received digital data; a packet format for the received digital data; analog to digital conversion scheme in accordance with parameter(s) of the communication scheme and of the data conveyance scheme of transmitted data by other LVDCs; and digital filtering parameters (e.g., bandwidth, slew rate, center frequency, digital filter coefficients, number of taps of digital filtering, stages of digital filtering, etc.).

A transmit parameter includes one of: a digital data format for the transmit digital data; a packet format for the transmit digital data; and digital to analog conversion in accordance with parameter(s) of the communication scheme and of the data conveyance scheme.

Once the LVDC 26 is set up for a particular data communication, the transmit DAC circuit 110 receives the transmit digital data 90 from its host device 104 in one of the formats of FIG. 9, or another format, and at a data rate of the host device (e.g., 100 Mbps, 1 Gbps, etc.) If necessary, the transmit DAC circuit 110 converts the format of the transmit digital data 90 in accordance with one or more transmit parameters 132. In addition, the transmit DAC circuit 110 synchronizes the transmit digital data with a bus data rate (e.g., the data rate at which data is transmitted via a line of the bus 80) to produce a digital input of n-bits per interval of the bus data rate, where "n" is an integer greater than or equal to one.

The transmit DAC circuit 110 converts the digital input into analog outbound data 134 via a range limited digital to analog converter (DAC) and a DC reference source. The drive sense circuit 106 converts the analog outbound data 134 into the analog transmit signal 96 and drives it on to a line of the bus 80.

The drive sense circuit 106 receives the analog receive signal 98 from the bus 80 and converts it into analog inbound data 124. The receive ADC circuit 108 converts the analog inbound data 124 into digital inbound data. The receive ADC circuit 108 filters the digital inbound data in accordance with one or more receive parameters 126 to produce the filtered data. The receive ADC circuit 108 formats and packetizes the filtered data in accordance with one or more receive parameters 126 to produce the received digital data 88. The receive ADC circuit 108 provides the received digital data 88 to the host device 104.

Figure 12:
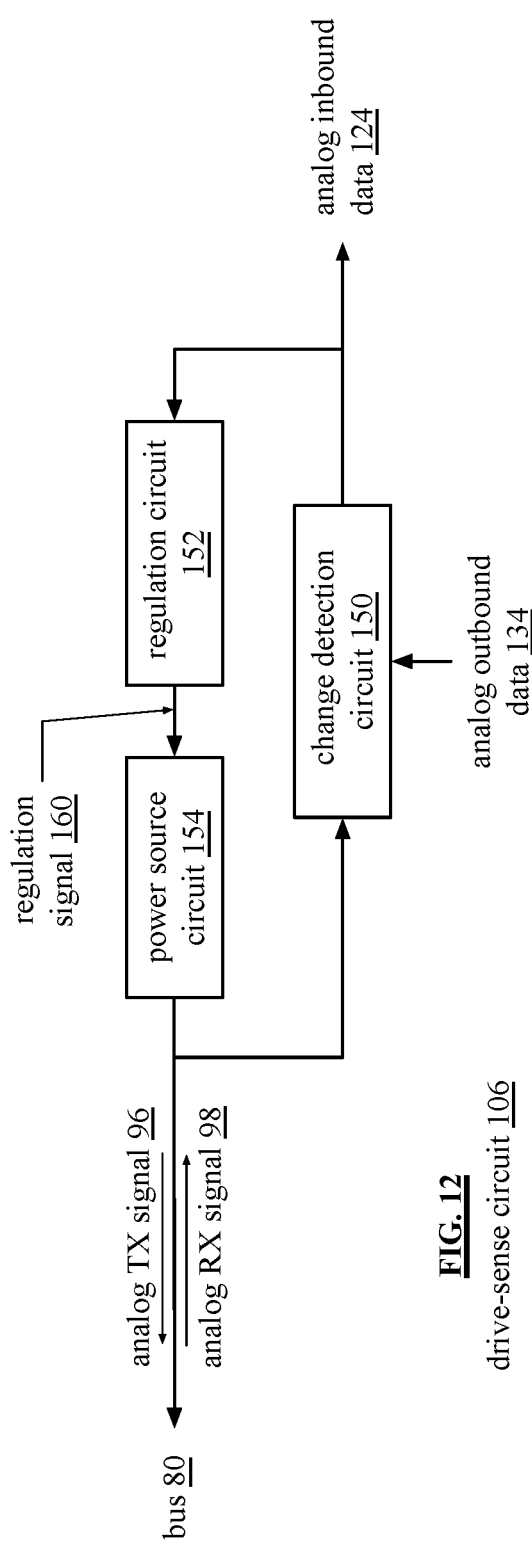
FIG. 12 is a schematic block diagram of an embodiment of a drive sense circuit of an LVDC coupled to a host device in accordance with the present invention.

FIG. 12 is a schematic block diagram of an embodiment of a drive sense circuit 106 of a Low Voltage Drive Circuit (LVDC) 26 coupled to one or more lines of a bus 80. The line(s) of the bus are coupled to one or more other LVDCs. The drive sense circuit 106 includes a change detection circuit 150, a regulation circuit 152, and a power source circuit 154.

The change detection circuit 150, the regulation circuit 152, and the power source circuit 154 operate in concert to keep the inputs of the change detection circuit 150 to substantially match (e.g., voltage to substantially match, current to substantially match, impedance to substantially match). The inputs to the change detection circuit 150 include the analog outbound data 134 and the signals on the line(s) of the bus 80 (e.g., the analog RX signal 98 and the analog TX signal 96).

When there is no analog RX signal, the only signal on the bus is the analog transmit signal 96. The analog transmit signal is created by adjusting the operation of the change detection circuit 150, the regulation circuit 152, and the power source circuit 154 to match the analog outbound data 134. Since the analog transmit signal 96 tracks the analog outbound data 134 within the drive sense circuit 106, when there is no analog RX signal 158, the analog inbound data 124 is a DC value.

When an analog RX signal 98 is being received, the change detection circuit 150, the regulation circuit 152, and the power source circuit 154 continue to operate in concert to keep the inputs of the change detection circuit 150 to substantially match. With the presence of the analog RX signal 98, the output of the change detection circuit 150 will vary based on the analog RX signal 98, which produces the analog inbound data 124. The regulation circuit 152 converts the analog inbound data 124 into a regulation signal 160. The power source circuit 154 adjusts the generation of its output (e.g., a regulated voltage or a regulated current) based on the regulation signal 160 to keep the inputs of the change detection circuit 150 substantially matching.

Figure 13:
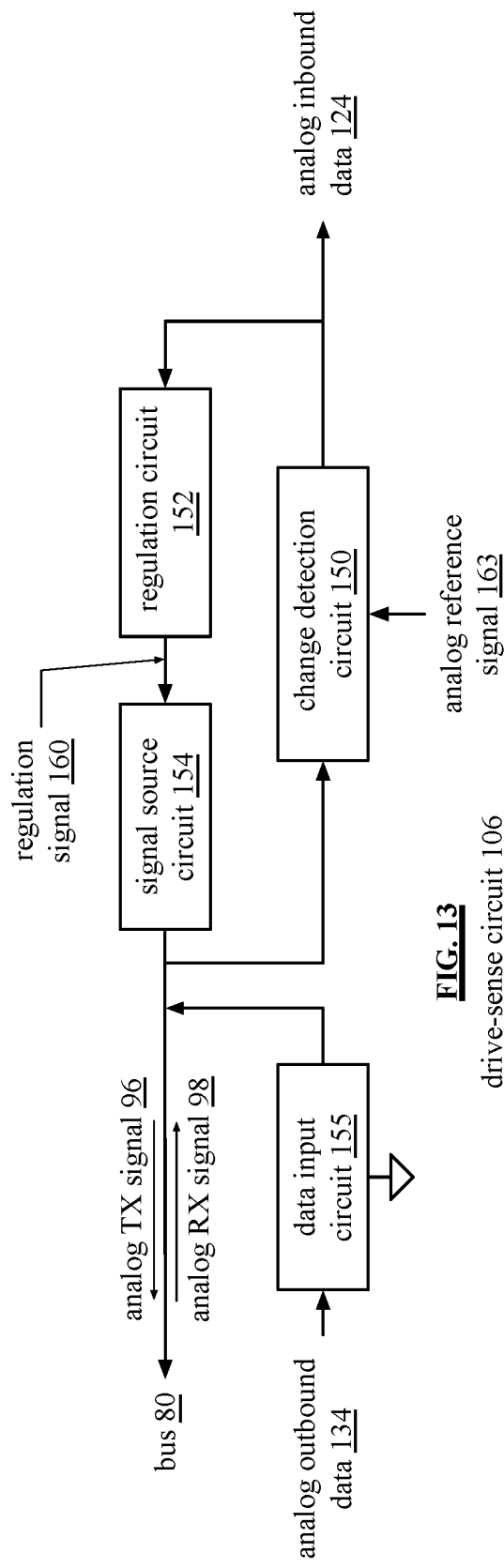
FIG. 13 is a schematic block diagram of another embodiment of a drive sense circuit of an LVDC coupled to a host device in accordance with the present invention.

FIG. 13 is a schematic block diagram of another embodiment of a drive sense circuit 106 of an LVDC 26 coupled to one or more lines of a bus 80. The drive sense circuit 106 includes the change detection circuit 150, the regulation circuit 152, the power source circuit 154, and a data input circuit 155. The change detection circuit 150, the regulation circuit 152, and the power source circuit 154 function as discussed with reference to FIG. 14 to keep the inputs of the change detection circuit 150 substantially matching. In this embodiment, however, the inputs to the change detection circuit 150 are the signals on the bus (e.g., the analog transmit signal 96 and the analog receive signal 98) and an analog reference signal 163 (e.g., a DC voltage reference signal or DC current reference signal). The analog outbound data 134 is inputted to the data input circuit 155.

The data input circuit 155 creates the analog transmit signals 96 from the analog outbound data 134 and drives it on to the bus 80. In an example, the data input circuit 155 changes the loading on the bus in accordance with the analog inbound data 134 to produce the analog transmit signal 96.

Since the analog transmit signal 156 is being created outside of the feedback loop of the change detection circuit 150, the regulation circuit 152, and the power source circuit 154, the analog inbound data 124 will include a component corresponding to the analog receive signal 98 and another component corresponding to the analog transmit signal 96.

Figure 14:
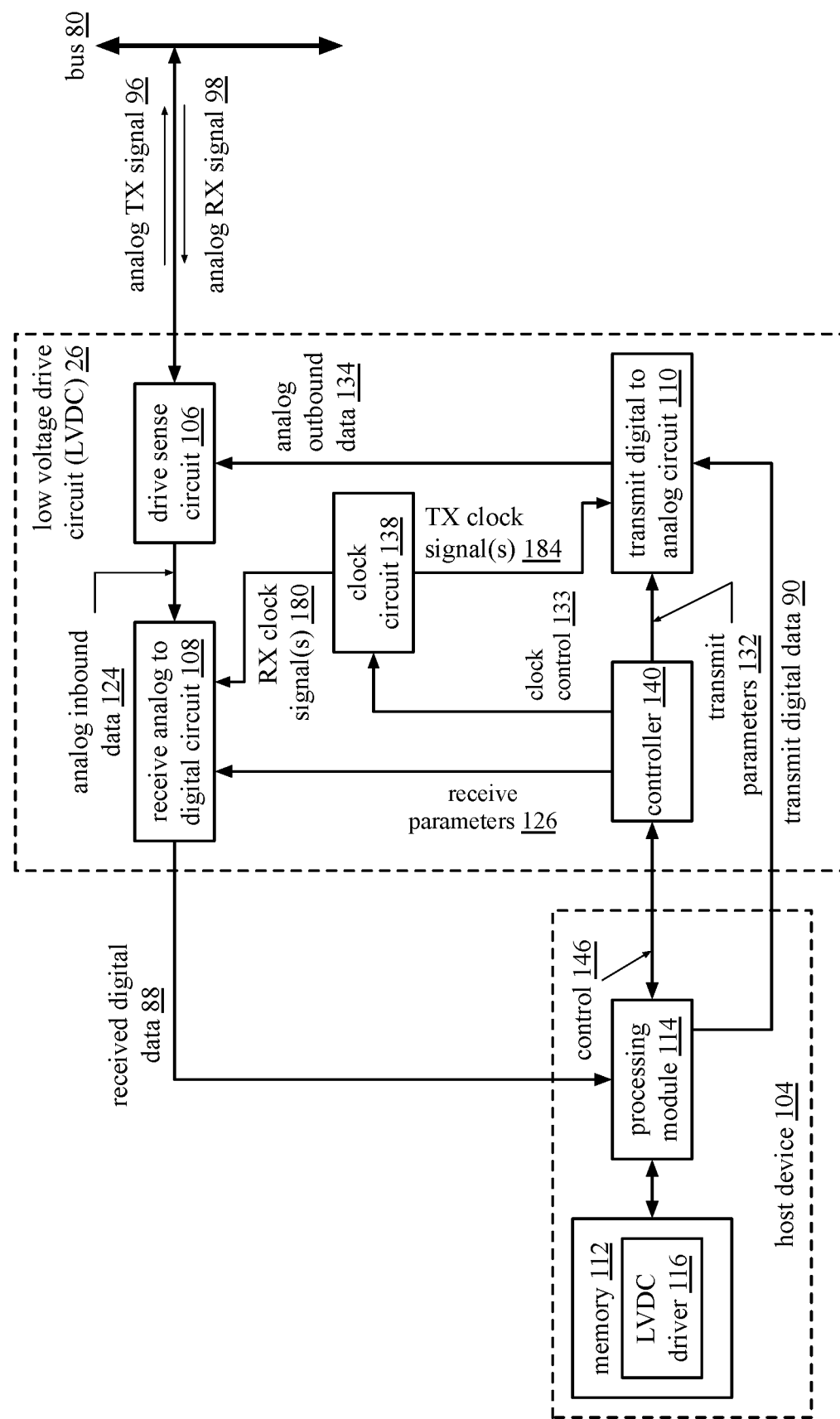
FIG. 14 is a schematic block diagram of another embodiment of an LVDC coupled to a host device in accordance with the present invention.

FIG. 14 is a schematic block diagram of another embodiment of a Low Voltage Drive Circuit (LVDC) 26 coupled to a host device 104 and to one or more lines of a bus 80. The host device 104 includes a processing module 114 and memory 112 (e.g., volatile memory and/or non-volatile memory). The memory 112 stores at least part of an LVDC driver 116 application. The LVDC 26 includes a drive sense circuit 106, a receive analog to digital converter (ADC) circuit 108, a transmit digital to analog converter (DAC) circuit 110, a clock circuit 138, and a controller 140. The drive sense circuit 106, the receive ADC circuit 108, and the transmit DAC circuit 110 function as previously discussed with reference to FIG. 11.

In this embodiment, the processing module 114 of the host device 104 accesses the LVDC driver 116 to determine control information 146 to set up the LVDC 26 for operation. The processing module provides the control information 146 to the controller 140, which generates the receive parameters 126, the transmit parameters 132, and clock control signals 133 from the control information 146. In addition, the controller 140 determines one or more communication scheme parameters and/or one or more data conveyance scheme parameters based on the control information 146.

In an embodiment, the controller 140 is a processing module with associated memory. The memory (e.g., volatile and/or non-volatile) stores a plurality of look up tables: a first for the communication parameters; a second for the data conveyance scheme parameters; a third for the transmit parameters 132; a fourth for the receive parameters 126; and a fifth for clock control parameters 133 (e.g., clock rate settings, duty cycle settings, etc.).

The clock circuit 138 is operable to create one or more transmit clock signals 184 and to create one or more receive clock signals 180 based on the clock control parameters, or information, 133. For example, the clock circuit 138 generates a first receive clock signal for outputting the receive digital data 88 to the host device 104 and a second receive clock for converting the analog inbound data 124 into digital inbound data. As another example, the clock circuit 138 generates a first transmit clock for receiving the transmit digital data 90 from the host device and a second transmit clock for converting the transmit digital data 90 into the analog outbound data 134.

Figure 15:
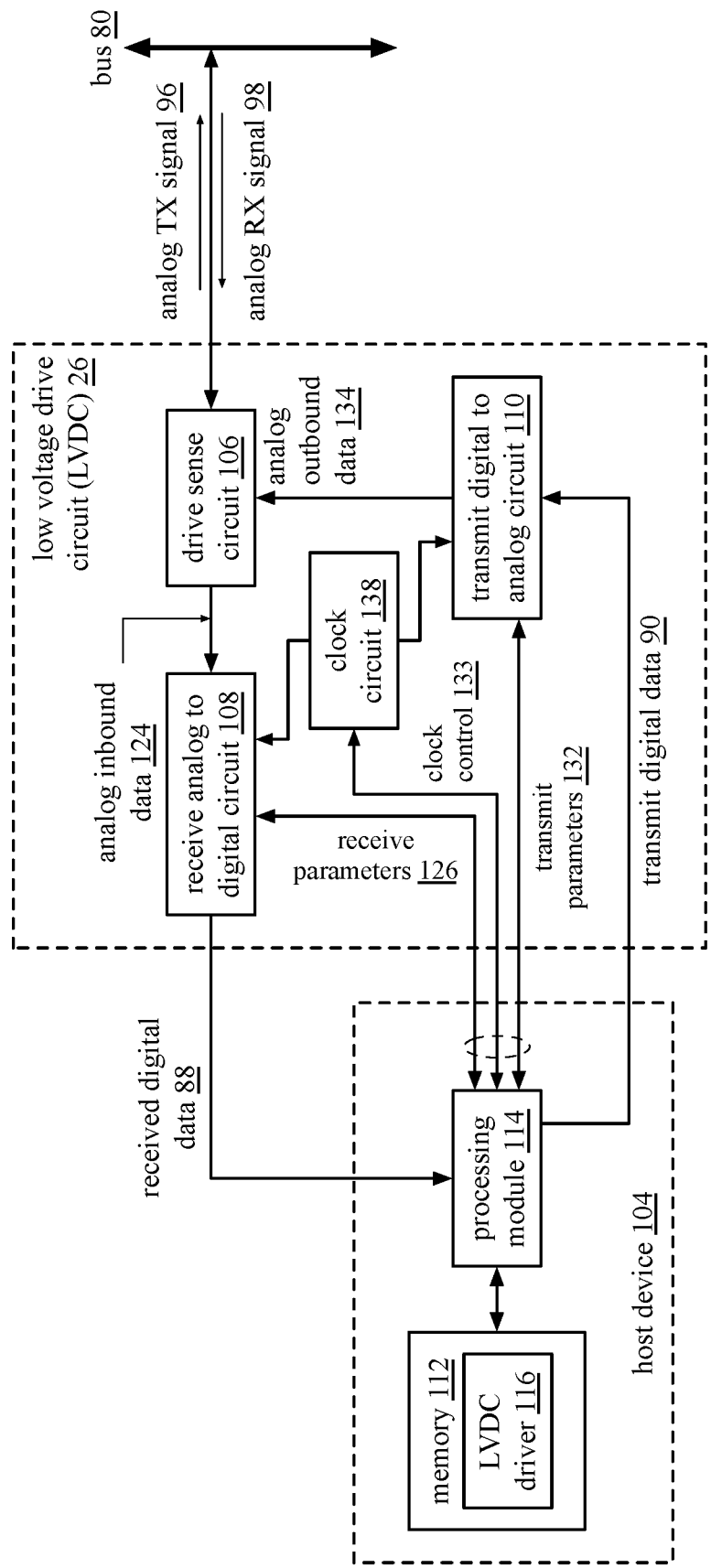
FIG. 15 is a schematic block diagram of another embodiment of an LVDC coupled to a host device in accordance with the present invention.

FIG. 15 is a schematic block diagram of another embodiment of a Low Voltage Drive Circuit (LVDC) 26 coupled to a host device 104 and to one or more lines of a bus 80. This embodiment of the LVDC 26 is similar to that of FIG. 14 with the exception that this embodiment does not include the controller 140. As such, the processing module 114 generates the receive parameters 126, the clock control information 133, and the transmit parameters 132. The processing module 114 also generates the one or more communication scheme parameters and the one or more data conveyance scheme parameters.

Figure 16:
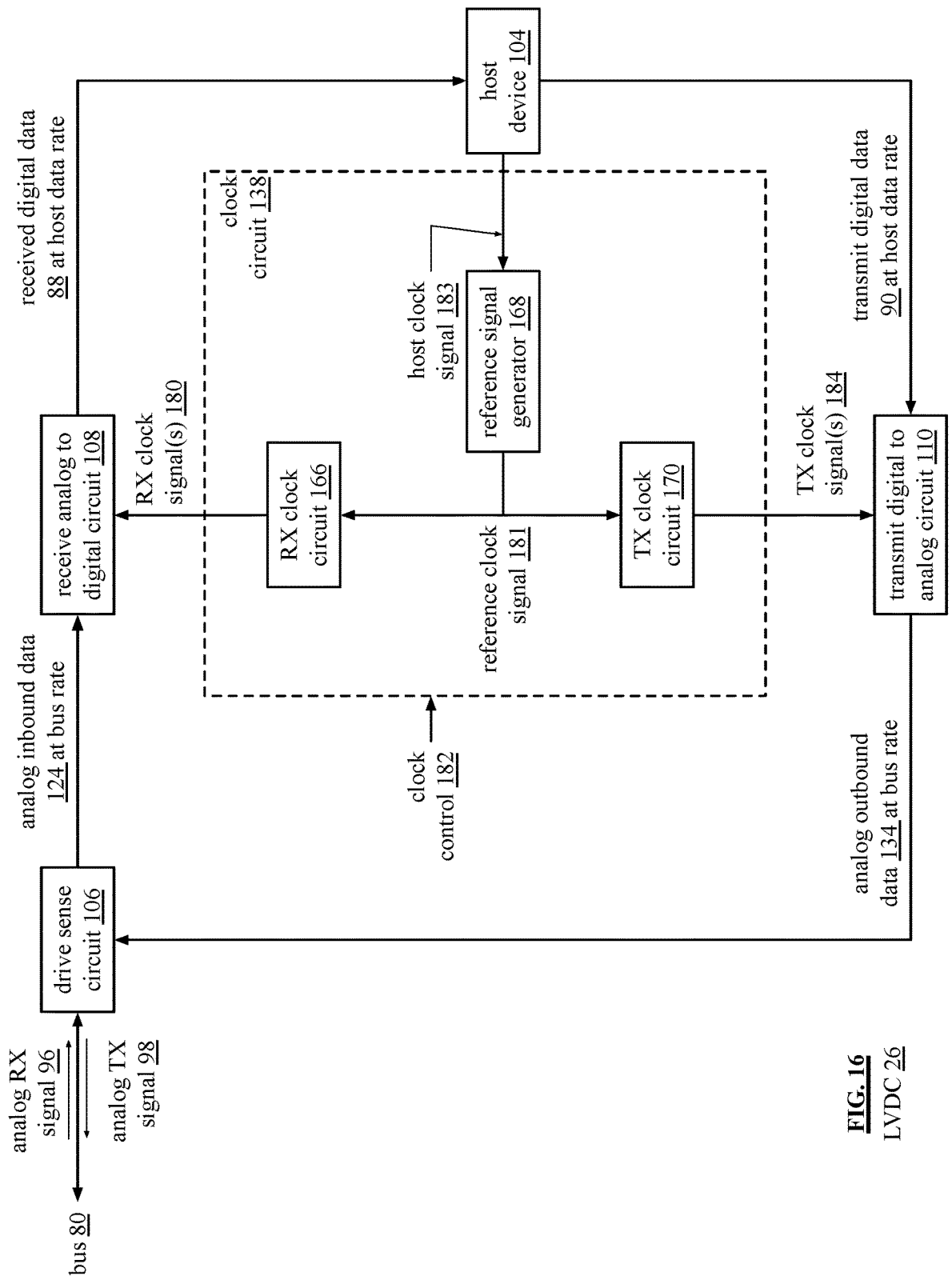
FIG. 16 is a schematic block diagram of another embodiment of an LVDC in accordance with the present invention.

FIG. 16 is a schematic block diagram of another embodiment of a Low Voltage Drive Circuit (LVDC) 26 coupled to a host device 104 and to one or more lines of a bus 80. The LVDC 26 includes a drive sense circuit 106, a receive analog to digital converter (ADC) circuit 108, a transmit digital to analog circuit 110, and a clock circuit 138. The clock circuit 138 includes a reference signal generator 168, a receive (RX) clock circuit 166, and a transmit (TX) clock circuit 170. The reference signal generator 168 may be implemented in a variety of ways to produce a reference clock signal 181. For example, the reference signal generator 168 is a phase locked loop (PLL) with an input clock from the host device or from a crystal oscillator. As another example, the reference signal generator 168 is a digital frequency synthesizer. As yet another example, the reference signal generator 168 is an oscillator.

The transmit clock circuit 170 includes one or more of: one or more frequency dividers, one or more frequency multipliers, one or more phase shift circuits, and one or more PLLs to generate transmit clock signals 184 from the reference clock signal 181. For example, the host clock signal 183 is a 2.000 GHz clock. The reference signal generator 168 creates a reference clock signal 181 of 2.100 GHz from the host clock signal. The transmit clock circuit 170 generates a 2.000 GHz clock used by the transmit digital to analog circuit 110 to receive the transmit digital data 90 from the host device 104 in sync with the host clock signal 183. The transmit clock circuit 170 also generates a 2.010 GHz clock signal for a transmit channel having a 2.010 GHz frequency. The transmit digital to analog circuit 110 uses the 2.010 GHz clock signal to generate the analog outbound data 134 to be in sync with a bus clock.

The receive clock circuit 166 also includes one or more of: one or more frequency dividers, one or more frequency multipliers, one or more phase shift circuits, and one or more PLLs to generate receive clock signals 180 from the reference clock signal 181. For example, the host clock signal 183 is a 2.000 GHz clock. The reference signal generator 168 creates a reference clock signal 181 of 2.100 GHz from the host clock signal. The receive clock circuit 166 generates a 2.020 GHz clock signal for a receive channel having a 2.020 GHz frequency. The receive analog to digital circuit 108 uses the 2.020 GHz clock signal to receive the analog inbound data 124 in sync with the bus clock. The receive clock circuit 166 also generates a 2.000 GHz clock used by the receive analog to digital circuit 108 to provide the received digital data 88 to the host device 104 in sync with the host clock signal 183.

Figure 17:
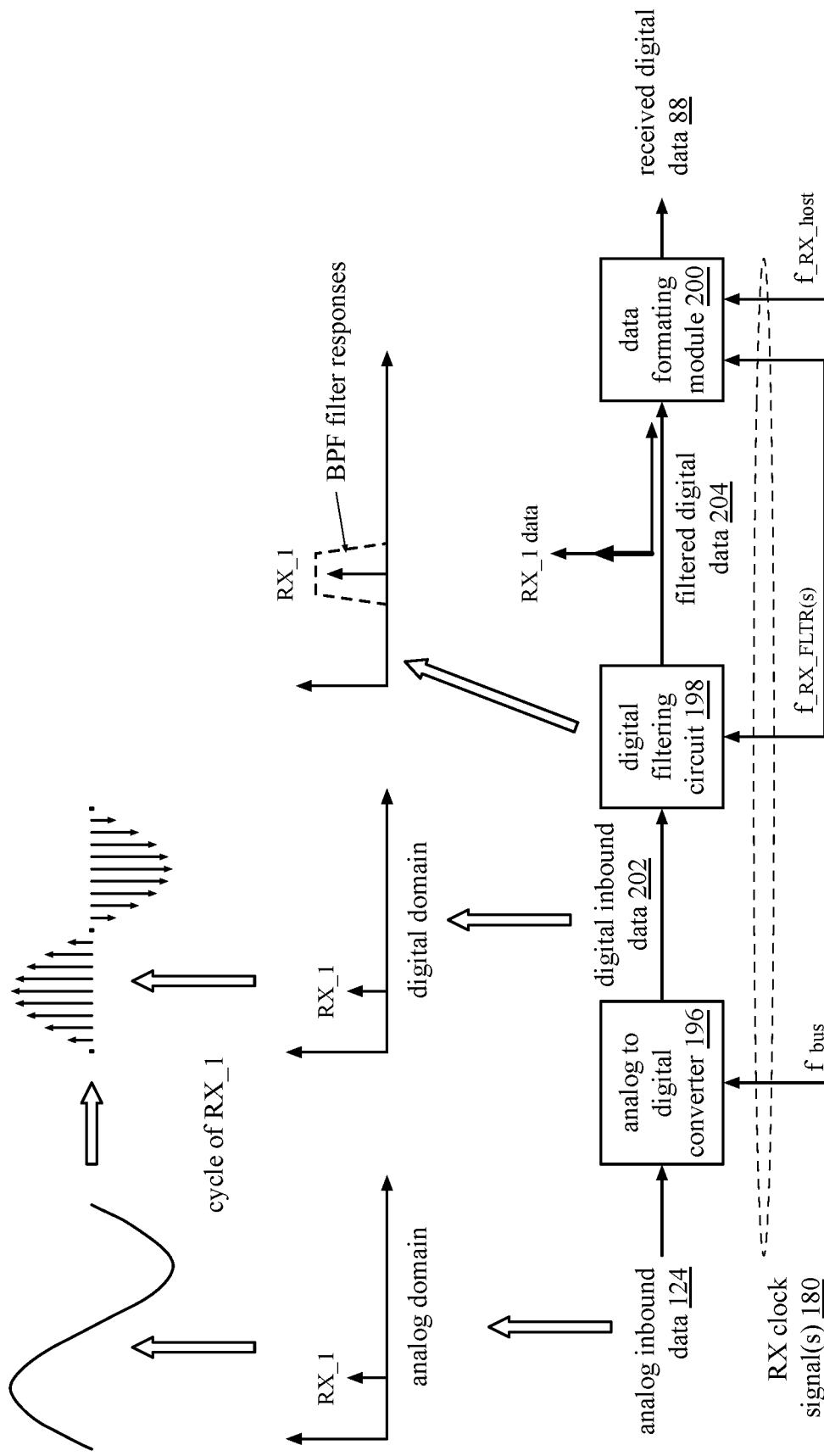
FIG. 17 is a schematic block diagram of an embodiment of a receive analog to digital circuit in accordance with the present invention.

FIG. 17 is a schematic block diagram of an embodiment of a receive analog to digital circuit 108 that includes analog to digital converter (ADC) 196, digital filtering circuit 198, and data formatting circuit 200. Analog inbound data 124 is a sinusoidal data signal/data stream represented in the analog frequency domain as tone RX_1 (i.e., a particular frequency). Analog inbound data 124 may include more than one sinusoidal data stream where each data stream is represented by an individual tone in the analog frequency domain (e.g., RX_1, RX_2, etc.). Analog inbound data 124 may be encoded via amplitude shift keying (ASK), phase shift keying (PSK), frequency shift keying (FSK), and/or another type of encoding.

ADC 196 uses a clock signal f bus of RX clock signals 180 to receive analog inbound data 124 in sync with a bus clock. ADC 196 converts analog inbound data 124 into digital inbound data 202 where digital inbound data 202 is a set of discrete values representative of analog inbound data 124. Digital inbound data 202 is represented in the digital frequency domain as tone RX_1. Digital inbound data 202 may include more than one tone in the digital frequency domain when representing more than one analog sinusoidal signal of the analog inbound data 124.

Digital filtering circuit 198 filters the digital inbound data 202 in accordance with one or more receive parameters to produce the filtered data 204. A receive parameter includes one of: a digital data format for the received digital data; a packet format for the received digital data; analog to digital conversion scheme in accordance with parameter(s) of the communication scheme and of the data conveyance scheme of transmitted data by other LVDCs; and digital filtering parameters (e.g., bandwidth, slew rate, center frequency, digital filter coefficients, number of taps of digital filtering, stages of digital filtering, etc.).

As an example, digital filtering circuit 198 includes a digital bandpass filter (BPF) tuned to extract data at a particular frequency (e.g., RX_1). A digital BPF has a bandpass frequency range and a center frequency (f), where f is set to correspond to a channel and where a channel is carrying a frequency domain digital inbound data 202 signal (e.g., RX_1). When digital inbound data 202 includes more than one signal (e.g., RX_1 through RX_n), digital filtering circuit 198 includes more than one BPF, where each BPF is tuned for a different channel corresponding to desired digital inbound data 202. For example, a first digital BPF is tuned for frequency RX_1, a second digital BPF is tuned for frequency RX_2, and so on.

Digital filtering circuit 198 filters digital inbound data 202 and outputs "n"-bit digital values of filtered digital data 204 corresponding to a cycle of the digital inbound data 202, where "n" is an integer greater than or equal to 1. Depending on the way analog inbound data 124 is encoded, a digital BPF uses amplitude shift keying (ASK), phase shift keying (PSK), and/or frequency shift keying (FSK) filtering to produce the "n"-bit digital value representative of the digital inbound data 202 per cycle of RX_1 (e.g., by interpreting amplitude, phase, and/or frequency). In a 1-bit ASK filtering example, an ASK filtering BPF interprets amplitude of each cycle of digital inbound data 202 as corresponding to a digital logic "0" or a digital logic "1." Cycles having a first magnitude (e.g., 0.005 V) are interpreted as digital logic value "0" and cycles having a second magnitude (e.g., 0.010 V) are interpreted as digital value "1." Digital filtering circuit 198 uses clock signal $f_{\_RX\_FLTR(s)}$ of RX clock signals 180 to receive the digital inbound data 202 in sync with a filter clock. The filter clock operates at a rate in accordance with the number of taps per data cycle a BPF has. For example, a BPF with 16 taps has a filter clock rate of 16 clock cycles for every one data cycle. Filter and data clock cycles will be discussed in greater detail with reference to FIG. 22.

Data formatting module 200 formats and packetizes the filtered digital data 204 in accordance with the one or more receive parameters to produce the received digital data 88. For example, the data formatting module 200 converts the filtered data 204 to binary format and packetizes the formatted data to produce the received digital data 88. Data formatting module 200 uses clock signal $f_{\_RX\_FLTR(s)}$ of RX clock signals 180 to receive the digital filtered data 204 in sync with a filter clock and $f_{\_RX\_host}$ of RX clock signals 180 to sync output of received digital data 88 at the data rate of a host.

Figure 18A:
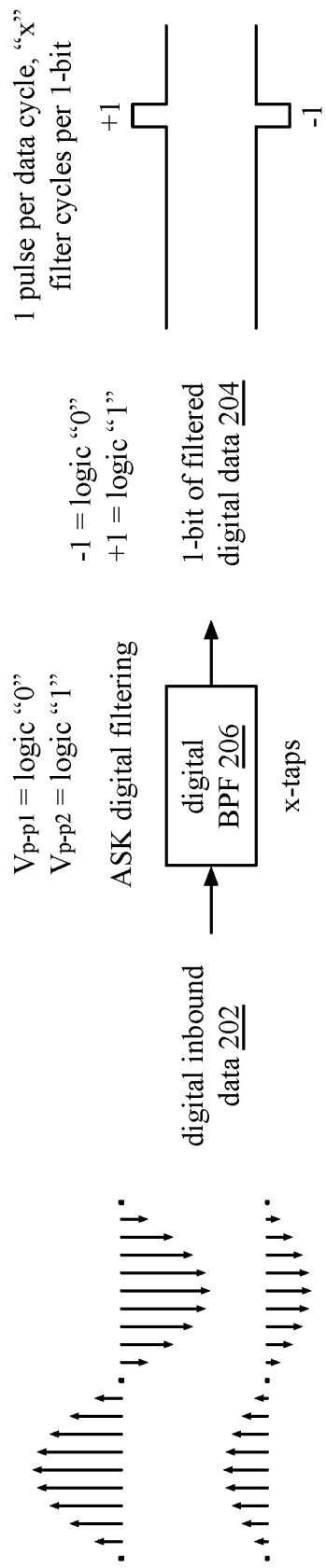

FIGS. 18A-18F-3 are schematic block diagrams of embodiments of a digital filtering circuit 198. In FIG. 18A, digital filtering circuit 198 includes digital bandpass filter (BPF) 206 implementing amplitude shift keying (ASK) digital filtering (e.g., analog inbound data was encoded using ASK) where the magnitude of a cycle of digital inbound data 202 corresponds to a "n"-bits of filtered digital data. In a 1-bit example, a cycle of digital inbound data 202 with magnitude $V_{p\text{-}p1}$ (e.g., 0.5 V) represents a digital logic value of "0" and a cycle of digital inbound data 202 with magnitude $V_{p\text{-}p2}$ (e.g., 1 V) represents a digital logic value of "1." Digital BPF 206 includes "x" number of taps (i.e., stages) for filtering digital inbound data 202. When digital BPF 206 recognizes the pattern of one cycle of digital inbound data 202 across the "x" taps at a particular magnitude, digital BPF 206 outputs a pulse representative of 1-bit of filtered digital data 204 corresponding to that magnitude.

As such, digital BPF 206 outputs one pulse per "x" filter cycles representative of 1-bit of filtered digital data 204 corresponding to magnitude where "x" is an integer of 1 or more. For example, digital BPF 206 filters one cycle of digital inbound data 202 with $V_{p\text{-}p1}$ (e.g., 0.005V) and produces a pulse representative of 1-bit of filtered digital data corresponding to $V_{p\text{-}p1}$ (e.g., logic "0"). For example, BPF 206 produces a −1 pulse to represent 1-bit of filtered digital data 204 corresponding to logic "0." Thus, BPF 206 produces 1 pulse per data cycle and 1-bit of data per "x" filter cycles. The data rate is equal to the clock rate divided by the "x" number of taps. For example, if the clock rate is 60 GHz and the digital BPF 206 has 32 taps, the data rate is 1.875 Gbps. Filter and data clock cycles will be discussed in greater detail with reference to FIG. 22.

Digital inbound data 202 can have the same amount of taps for filtering varying frequencies (e.g., RX_1, RX_2, etc.). For example, BFP 206 has different sampling rates to adjust for the different frequencies and a variable hold period.

Figure 18B:
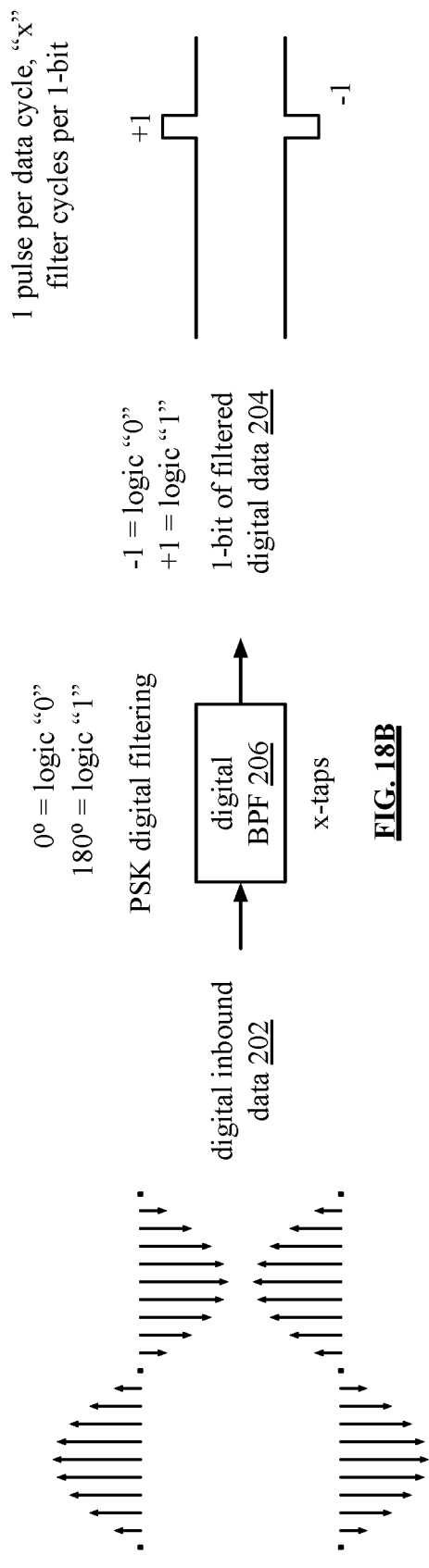

In FIG. 18B, digital filtering circuit 198 includes a digital bandpass filter (BPF) 206 implementing phase shift keying (PSK) digital filtering (e.g., analog inbound data was encoded using PSK) where the phase shift of a cycle of digital inbound data 202 corresponds to a "n"-bit digital logic value. In a 1-bit example, a cycle of digital inbound data 202 with phase 0° represents a digital logic value of "0" and a cycle of digital inbound data 202 with a phase 180° represents a digital logic value of "1." Digital BPF 206 includes "x" number of taps (i.e., stages) for filtering digital inbound data 202, where "x" is an integer of 1 or more. When digital BPF 206 recognizes the pattern of one cycle of digital inbound data 202 across the n taps at a particular phase, digital BPF 206 outputs a pulse representative of 1-bit of filtered digital data 204 corresponding to that phase.

As such, digital BPF 206 outputs one pulse per "x" filter cycles representative of 1-bit of filtered digital data 204 corresponding to phase. For example, digital BPF 206 filters one cycle of digital inbound data 202 with 0° phase shift and produces a pulse representative of 1-bit of filtered digital data corresponding to 0° phase (e.g., logic "0"). For example, BPF 206 produces a −1 pulse to represent 1-bit of filtered digital data corresponding to logic "0." Thus, BPF 206 produces 1 pulse per data cycle, and 1-bit of data per "n" filter cycles.

In FIG. 18C, digital filtering circuit 198 includes digital bandpass filters (BPF) 206-1 and 206-2 implementing frequency shift keying (FSK) digital filtering (e.g., analog inbound data was encoded using FSK) where the frequency of a cycle of digital inbound data 202 corresponds to a digital logic value. In a 1-bit example, two BPFs 206-1 and 206-2 are needed: one for interpreting digital logic "0" and one for interpreting digital logic "1." The amount of BPFs needed for FSK filtering will be equal to 2 times the number of bits represented at the output. Since 1-bit is shown here, 2 BPF FSK filters are needed.

BPF 206-1 is set to look for a cycle of digital inbound data 202 with a frequency f2 representing a digital logic value of "1" and BPF 206-1 is set to look for a cycle of digital inbound data 202 with frequency f2 representing a digital logic value of "1." BPF 206-1 and BPF 206-2 include "x" number of taps (i.e., stages) for filtering digital inbound data 202, where "x" is an integer of 1 or more. In a 1-bit example, when BPF 206-1 recognizes the pattern of one cycle of digital inbound data 202 across its "x" taps at f2, digital BPF 206-1 outputs a pulse representative of 1-bit of filtered digital data 204 corresponding to f2. When BPF 206-2 recognizes the pattern of one cycle of digital inbound data 202 across its "x" taps at f1, digital BPF 206-2 outputs a pulse representative of 1-bit of filtered digital data 204 corresponding to f1.

For example, digital BPF 206-2 filters one cycle of digital inbound data 202 with frequency f1 and produces a pulse representative of 1-bit of filtered digital data corresponding to f1 (e.g., logic "0"). For example, BPF 206-2 produces a −1 pulse to represent 1-bit of filtered digital data corresponding to logic "0." Thus, BPF 206-2 produces 1 pulse per data cycle at f1, and 1-bit of data per "x" filter cycles. The output of BPF 206-1 and 206-2 includes a latch where, when BPF 206-1 filters one cycle of digital inbound data 202 with frequency f2, a 1 pulse is output to represent 1-bit of filtered digital data corresponding to logic "1," and when BPF 206-2 filters one cycle of digital inbound data 202 with frequency f1, a −1 pulse is output to represent 1-bit of filtered digital data corresponding to logic "0."

In FIG. 18D, digital filtering circuit 198 includes a digital bandpass filter (BPF) 206 implementing amplitude shift keying (ASK) digital filtering (e.g., analog inbound data was encoded using ASK) operable to produce "n"-bits of filtered digital data 204 per "x" filter cycles (e.g., based on "n" taps) where the magnitude of a cycle of digital inbound data 202 corresponds to a digital logic value and where "n" is an integer of 1 or more. In a 2-bit example, a cycle of digital inbound data 202 with magnitude $V_{p\text{-}p1}$ (e.g., 0.005 V) represents a digital logic value of "00," a cycle of digital inbound data 202 with magnitude $V_{p\text{-}p2}$ (e.g., 0.010 V) represents a digital logic value of "01," a cycle of digital inbound data 202 with magnitude $V_{p\text{-}p3}$ (e.g., 0.0155 V) represents a digital logic value of "10," and a cycle of digital inbound data 202 with magnitude $V_{p\text{-}p4}$ (e.g., 0.020 V) represents a digital logic value of "11." Digital BPF 206 includes "x" number of taps (i.e., stages) for filtering digital inbound data 202. When digital BPF 206 recognizes the pattern of one cycle of digital inbound data 202 across the "x" taps at a particular magnitude, digital BPF 206 outputs a pulse representative of 2-bits of filtered digital data 204 corresponding to that magnitude.

As such, digital BPF 206 outputs one pulse per "x" filter cycles representative of 2-bits of filtered digital data 204 corresponding to magnitude. For example, digital BPF 206 filters one cycle of digital inbound data 202 with $V_{p\text{-}p1}$ (e.g., 0.005 V) and produces a pulse representative of 2-bits of filtered digital data corresponding to $V_{p\text{-}p1}$ (e.g., logic "00"). For example, BPF 206 produces a −2 pulse to represent 2-bits of filtered digital data 204 corresponding to logic "00." Thus, BPF 206 produces 1 pulse per data cycle, and 2-bits of data per "x" filter cycles.

Figure 18E:
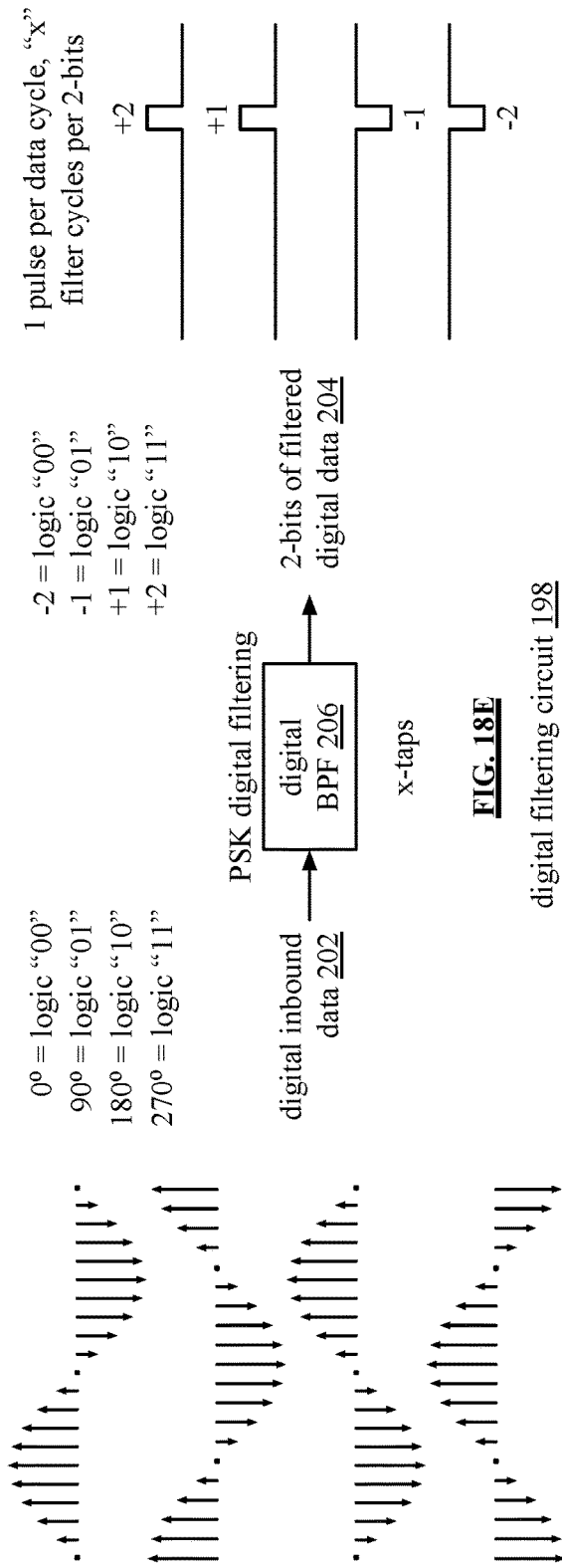

In FIG. 18E, digital filtering circuit 198 includes a digital bandpass filter (BPF) 206 implementing phase shift keying (PSK) digital filtering operable to produce "n"-bits of filtered digital data 204 per "x" filter cycles (e.g., based on "x" taps) where the phase of a cycle of digital inbound data 202 corresponds to a digital logic value and where "n" is an integer of 1 or more. In a 2-bit example, a cycle of digital inbound data 202 with phase 0° represents a digital logic value of "00," a cycle of digital inbound data 202 with phase 90° represents a digital logic value of "01," a cycle of digital inbound data 202 with phase 180° represents a digital logic value of "10," and a cycle of digital inbound data 202 with phase 270° represents a digital logic value of "11." Digital BPF 206 includes "x" number of taps (i.e., stages) for filtering digital inbound data 202. When digital BPF 206 recognizes the pattern of one cycle of digital inbound data 202 across the "x" taps at a particular phase, digital BPF 206 outputs a pulse representative of 2-bits of filtered digital data 204 corresponding to that phase.

As such, digital BPF 206 outputs one pulse per "x" filter cycles representative of 2-bits of filtered digital data 204 corresponding to phase. For example, digital BPF 206 filters one cycle of digital inbound data 202 with 0° phase and produces a pulse corresponding to 2-bits of filtered digital data 204 representative of logic "00." For example, BPF 206 produces a −2 pulse to represent 2-bits of filtered digital data corresponding to logic "00." Thus, BPF 206 produces 1 pulse per data cycle, and 2-bits of data per "x" filter cycles.

Figure 18F:
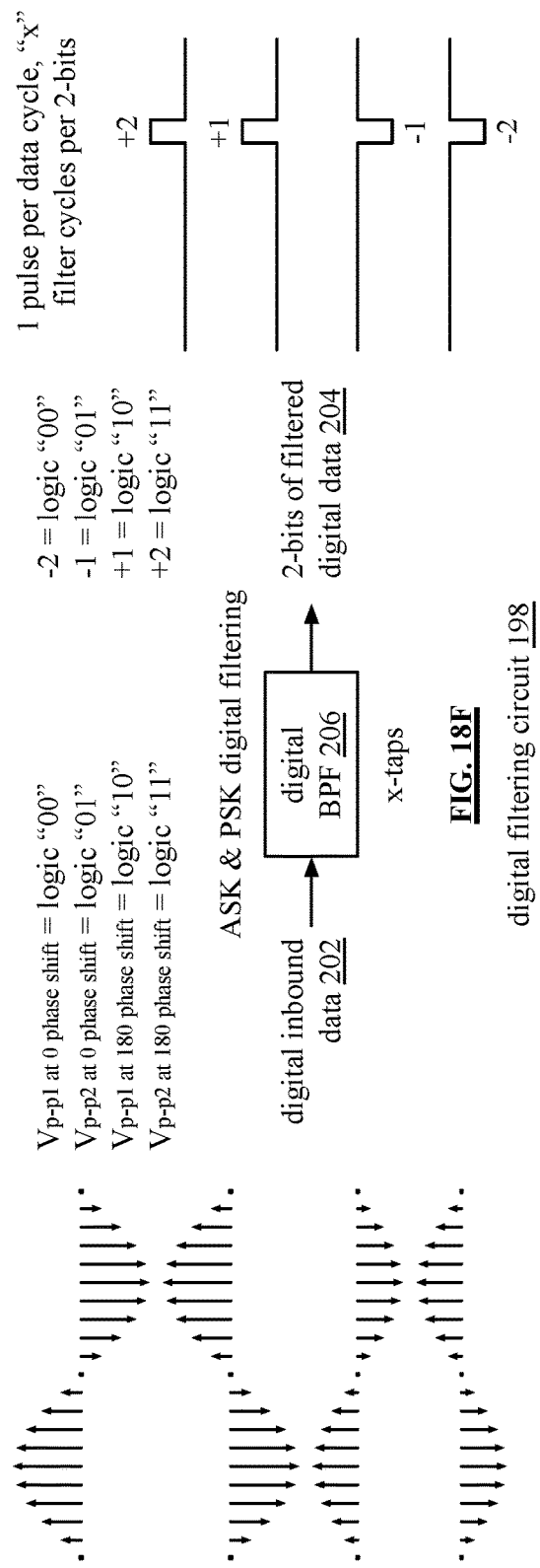

In FIG. 18F, digital filtering circuit 198 includes a digital bandpass filter (BPF) 206 implementing amplitude shift keying (ASK) and phase shift keying (PSK) digital filtering operable to produce "n"-bits of filtered digital data 204 per "x" filter cycles (e.g., based on "x" taps) where the magnitude and phase of a cycle of digital inbound data 202 corresponds to a digital logic value and where "n" is an integer of 1 or more. In a 2-bit example, a cycle of digital inbound data 202 with a magnitude $V_{p\text{-}p1}$ (e.g., 0.005 V) and a phase 0° represents a digital logic value of "00," a cycle of digital inbound data 202 with a magnitude $V_{p\text{-}p2}$ (e.g., 0.010 V) and a phase 90° represents a digital logic value of "01," a cycle of digital inbound data 202 with a magnitude $V_{p\text{-}p1}$ (e.g., 0.005 V) and a phase 180° represents a digital logic value of "10," and a cycle of digital inbound data 202 with a magnitude $V_{p\text{-}p2}$ (e.g., 0.010 V) and a phase 180° represents a digital logic value of "11." Digital BPF 206 includes "n" number of taps (i.e., stages) for filtering digital inbound data 202. When digital BPF 206 recognizes the pattern of one cycle of digital inbound data 202 across the "x" taps at a particular magnitude and phase, digital BPF 206 outputs a pulse representative of 2-bits of filtered digital data 204 corresponding to that magnitude and phase.

As such, digital BPF 206 outputs one pulse per "x" filter cycles representative of 2-bits of filtered digital data 204 corresponding to magnitude and phase. For example, digital BPF 206 filters one cycle of digital inbound data 202 with magnitude Vp-p1 (e.g., 0.005 V) and 0° phase and produces a pulse corresponding to 2-bits of filtered digital data 204 representative of logic "00." For example, BPF 206 produces a −2 pulse to represent 2-bits of filtered digital data corresponding to logic "00." Thus, BPF 206 produces 1 pulse per data cycle, and 2-bits of data per "x" filter cycles.

While the examples of FIGS. 18A-F-3 include 1 and 2-bit data outputs, data output can include "n" number of bits, where "n" is an integer greater than 1. Further, other amounts and combinations of BPFs 206 are possible for various types of filtering (e.g., a combination of ASK, PSK, and FSK filtering, etc.).

Figure 19:
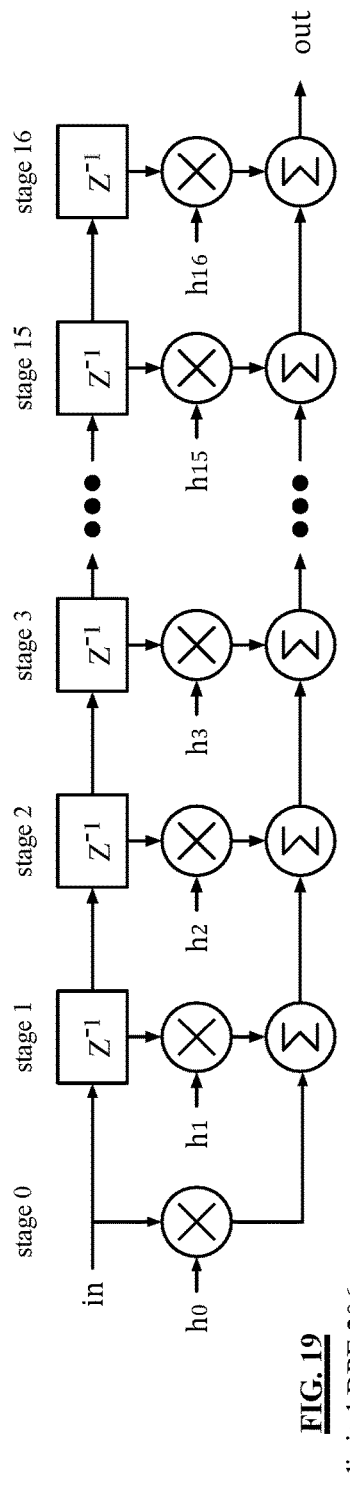
FIG. 19 is a schematic block diagram of an embodiment of a digital bandpass filter in accordance with the present invention.

FIG. 19 is a schematic block diagram of an embodiment of a digital bandpass filter (BPF) 206 that includes 16 taps. Digital BPF 206 could have more or less taps than the 16 shown (e.g., "x" taps where "x" is an integer of 1 or more) depending on how many data points/samples are needed to accurately interpret a cycle (or cycles) of the input signal. The input signal (e.g., digital inbound data 202) enters digital BPF 206 at stage 0 where it is multiplied by coefficient $h_0$ and also input into stage 1. Stages 1-16 each include a unit delay $Z^{-1}$ in Z-transform notation to provide delayed inputs (taps) to each stage's multiplication operation (i.e., the input signal is multiplied by the next coefficient (e.g., $h_1$-$h_{16}$) after a delay $Z^{-1}$). The results of the multiplication operation from each stage are added to create the output. In this example, the output is a pulse representative of 1 or 2-bits of filtered digital data 204 (e.g., −1 or 1 for 1-bits, and −2, −1, 1, 2 for 2-bits).

Figure 20:
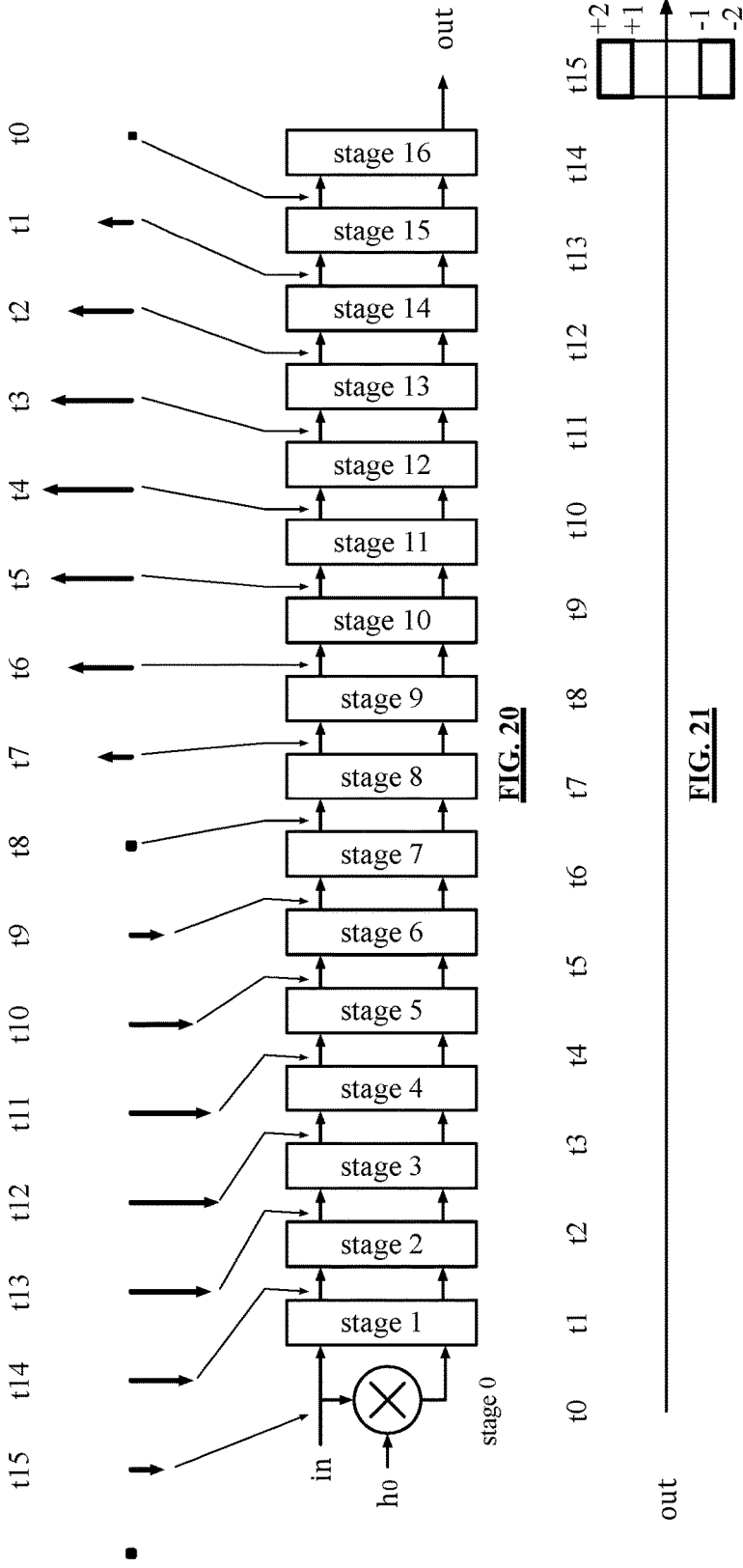
FIG. 20 is a schematic block diagram of another embodiment of the digital bandpass in accordance with the present invention.

FIG. 20 is a schematic block diagram of another embodiment of the digital bandpass filter (BPF) 206. Digital BPF 206 has 16 stages and filters an input signal (e.g., digital inbound data 202) from time t0 to t15. Digital BPF 206 is set to recognize when a full cycle of digital inbound data 202 has passed through its 16 taps. At a snapshot in time, every time the pattern is in the shown position (e.g., digital inbound data 202 enters BPF 206 at stage 0, time t0, and a full cycle of digital inbound data 202 is recognized at the taps of BPF 206 by stage 16, time t15), digital BPF 206 outputs a pulse representative of the input data at t15 (e.g., logic 1 or 0 for 1-bit or logic 00, 01, 10, or 11 for 2-bit based on magnitude, phase, and/or frequency, etc.).

Figure 21:
FIG. 21 is a schematic block diagram of an embodiment of the output of digital bandpass filter in accordance with the present invention.

FIG. 21 is a schematic block diagram of an embodiment of the output of digital bandpass filter (BPF) 206 of FIGS. 19 and 20. At time t15, when the pattern shown (e.g., one cycle of digital input data 202) in FIG. 20 is recognized by the digital BPF 206, digital BPF 206 outputs a pulse representative of the inbound digital data 202 (e.g., logic 1 or 0 for 1-bit or logic 00, 01, 10, or 11 for 2-bit based on magnitude, phase, and/or frequency, etc.). As a specific example, referring to FIG. 18F, digital BPF 206 filters one cycle of digital inbound data 202 with magnitude $V_{p-p1}$ (e.g., 0.5) and 0° phase (where 0.5 magnitude and 0° phase correspond to logic "00") and produces an output pulse of −2 corresponding to 2-bits of filtered digital data representative of logic "00" at time t15 (i.e., as soon as the pattern shown in FIG. 20 is recognized by the filter).

Figure 22:
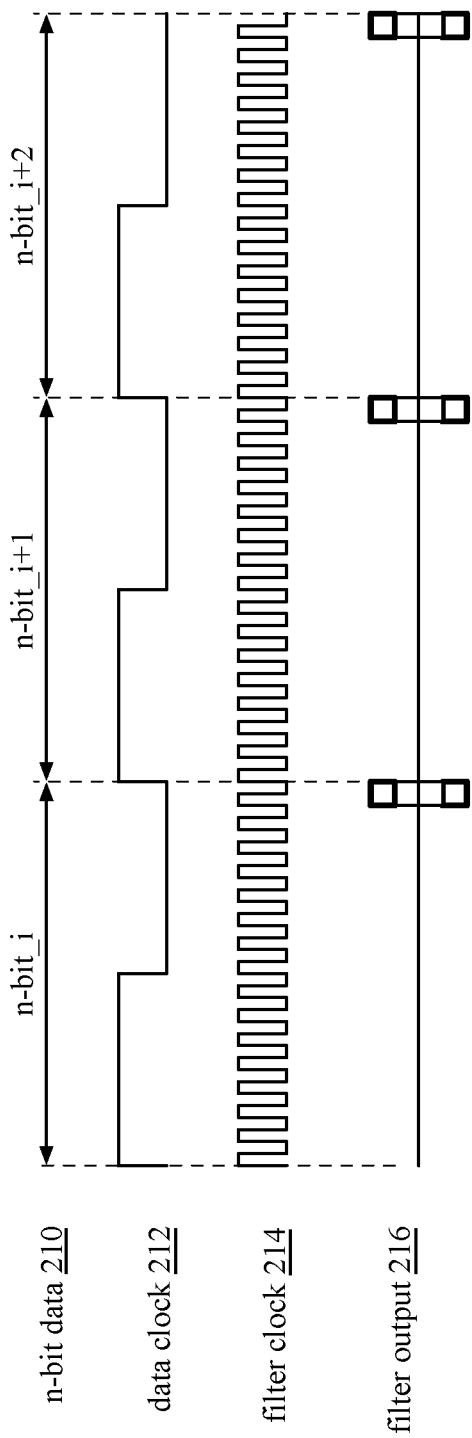
FIG. 22 is a schematic block diagram of an embodiment of data and filter clock cycles in accordance with the present invention.

FIG. 22 is a schematic block diagram of an embodiment of data and filter clock cycles. As discussed in FIGS. 17-18F, data is injected in the frequency of a channel such that the period of an analog signal corresponds to a data clock 212 cycle. In other words, data clock 212 corresponds to frequency of the channel or integer division thereof. For every cycle of data clock 212, digital filtering circuit 198 processes "n"-bits of filtered digital data 210. The filter clock 214 (e.g., of digital BPF 206 of FIGS. 18A-F and 19) is "x" times the data clock 212 (e.g., where "x" is 16 in a 16-tap filter example). At the end of the data clock 212 cycle (e.g., after 16 cycles of the filter clock 214), the filter outputs a pulse (e.g., filter output 216) representative of the input data (e.g., logic 1 or 0 for 1-bit or logic 00, 01, 10, or 11 for 2-bit based on magnitude, phase, and/or frequency, etc.)).

Figure 23:
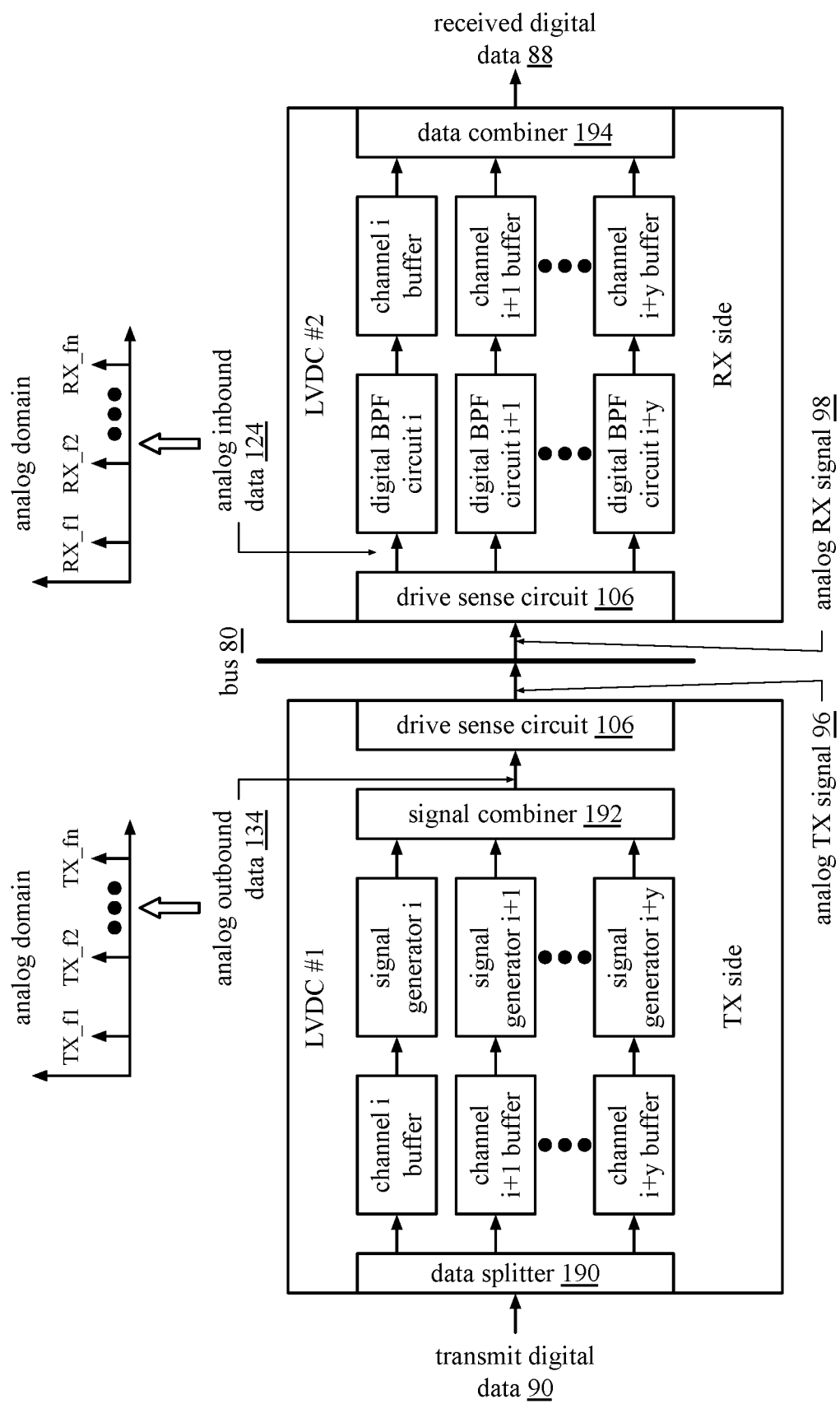
FIG. 23 is a schematic block diagram of an embodiment of a transmit side of one Low Voltage Drive Circuit (LVDC) and a receive side of another (LVDC) in accordance with the present invention.

FIG. 23 is a schematic block diagram of an embodiment of a transmit side of a first Low Voltage Drive Circuit (LVDC) coupled to a receive side of a second LVDC via one or more lines of a bus 80. The transmit side of the LVDC #1 includes a data splitter 190, a plurality of channel buffers (i through i+y), a plurality of signal generators (i through i+y), a signal combiner 192, and a drive sense circuit 106. With reference to FIGS. 11, and 14-16, the data splitter 190, the channel buffers (i through i+y), the signal generators (i through i+y), and the signal combiner 192 are included in the transmit digital to analog circuit 110.

The receive side of LVDC #2 includes a drive sense circuit 106, a plurality of digital bandpass filter circuits (BPF i through i+y), a plurality of channel buffers (i through i+y), and a data combiner 194. With reference to FIGS. 11, and 14-16, the digital bandpass filter circuits (BPF i through I+y), the channel buffers (i through i+y), and the data combiner 194 are included in the receive analog to digital circuit 108.

In an example, the data splitter 190 receives the transmit digital data 90 and divides it into a plurality of data streams. For example, data splitter 190 splits transmit digital data 90 a data packet amount of data at a time. Data packets will be discussed in greater detail with reference to FIGS. 29-30. A corresponding channel buffer stores a data stream. For instance, channel buffer i stores data stream i; channel buffer i+1 stores data stream i+1, and so on. The data streams are written into the channel buffers in accordance with the host data rate. The data, however, is read out of the channel buffers in accordance with transmit clock rates for each of the signal generators. The transmit clocks corresponds to the frequency of the channel being used by a signal generator.

Each enabled signal generator uses a different channel to convert bits of its respective data stream into respective portions of the analog outbound data 134. For example, signal generator i uses channel 1, which has a first frequency (f1), signal generator i+1 uses channel 2, which has a second frequency (f2), and so on. Note that, one or more of the signal generators is activated to convert the transmit digital data 90 into the analog outbound data 134.

As a specific example, signal generator i converts n-bits of its data stream at a time into an analog signal component of the analog outbound data 134, where n is an integer greater than or equal to one. For an n-bit sample of its data stream, the signal generator encodes the n-bit sample into a sinusoidal signal having a frequency at f1 using amplitude shift keying (ASK) signal and/or a phase shift keying (PSK) signal. Signal generator i+1 functions similarly by encoding an n-bit sample of its data stream into a sinusoidal signal having a frequency at f2 using ASK and/or PSK.

The drive sense circuit 106 of the first LVDC converts the analog outbound data 134 into an analog transmit signal 96, which it transmits on to a line of the bus 80. The drive sense circuit 106 of the second LVDC receives it as an analog receive signal 98 and converts it into analog inbound data 124. As such, without conversion, transmission, or reception errors, the analog inbound data 124 is substantially identical to the analog outbound data 134.

Each digital bandpass filter (BPF) circuit includes an analog to digital converter and a digital bandpass filter. Each active digital BPF circuit receives the analog inbound data 124. In addition, each active digital BPF circuit is tuned for a different channel. For example, digital BPF circuit i is tuned for frequency 1, digital BPF circuit i+1 is tuned for frequency 2, and so on. As such, digital BPF circuit i converts the analog inbound data into digital inbound data, filters it, and outputs the n-bit digital values corresponding to the data stream processed by signal generator i. Similarly, digital BPF circuit i+1 converts the analog inbound data into digital inbound data, filters it, and outputs the n-bit digital values corresponding to the data stream processed by signal generator i+1; and so on.

The channel buffers of the receive side of LVDC store the n-bit digital values outputted by their respective digital BPF circuits. The data combiner 194 retrieves data from the channel buffers and periodically outputs the received digital data 88. For example, a block of data is inputted into the data splitter 190 in accordance with a data rate of the host device (host 1) coupled to the first LVDC. As a specific simplified example, assume the data block includes 24-bits and is clocked into the data splitter serially over 24 intervals of a data clock of host 1. Further assume that the 24-bits are divided into three data streams, each 8-bits (i.e., 3, 8-bit data packets where data combiner combines signals a data packet worth of data at a time). As such, three paths will be activated between the data splitter 190 of LVDC #1 and the data combiner 194 of LVDC #2.

Each activated path operates independent of the other paths and at different rates to process their respective data streams of the data block. For example, the first path (e.g., signal generator i through digital BPF circuit i) operates in accordance with frequency f1, which is at slightly higher frequency than that of the data rate of host 1; the second path (e.g., signal generator i+1 through digital BPF circuit i+1) operates in accordance with frequency f2, which is at slightly higher frequency than that of frequency f1; and the third path (e.g., signal generator i+2 through digital BPF circuit i+2) operates in accordance with frequency f3, which is at slightly higher frequency than that of frequency f2.

Continuing with the simplified example, further assume that the data clock of host 1 is 1.000 GHz for a 125 Mega Byte per second (MBps) data rate, which corresponds to a 1 Gbps data rate; data is provided to the data splitter a byte at a time; frequency f1 is at 1.010 GHz, frequency f2 is at 1.020 GHz, and frequency f2 is at 1.030 GHz. There are a variety of ways the data splitter 190 can divide the data and put it into the channel buffers. For example, the data splitter 190 uses a bit-by-bit round robin distribution.

As data is put into the channel buffers on the transmit side, the signal generators begin to process them. In this example, a bit at a time. Since signal generator i+2 is operating at a rate that is faster than the other two signal generates, it will finish processing its 8-bits slightly before the others. As such, digital BPF circuit i+2 will finish recovering the 8-bits of data slightly before the other digital BPF circuits. The timing difference is compensated for by the buffers on each end such that, as 24-bits goes into the transmitting LVDC at the rate of the first host device, the same 24-bits will come out of the receiving LVDC at the rate of the host device of the second LVDC.

Figure 24:
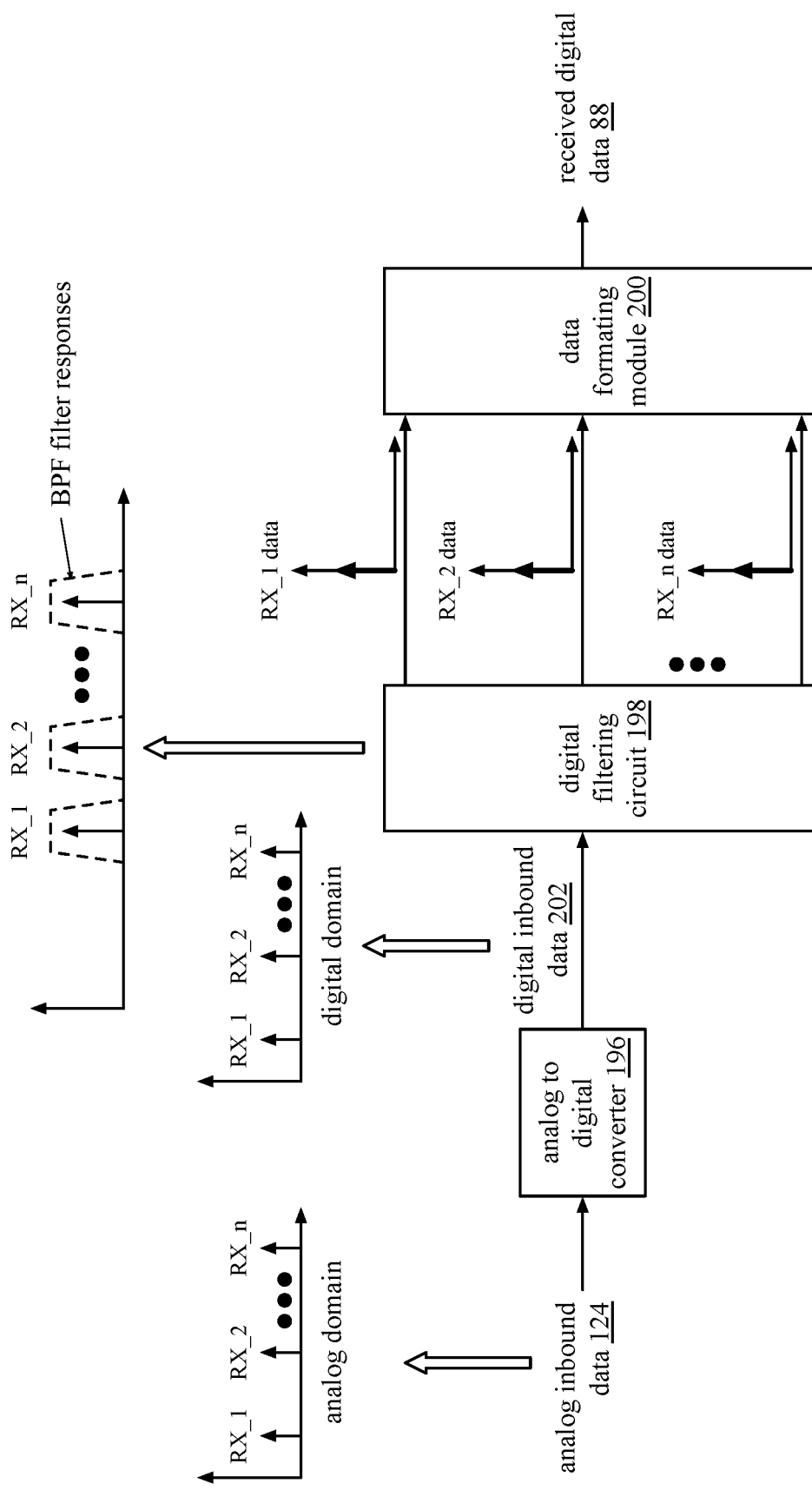
FIG. 24 is a schematic block diagram of another embodiment of the receive analog to digital circuit in accordance with the present invention.

FIG. 24 is a schematic block diagram of another embodiment of the receive analog to digital circuit 108 that includes analog to digital converter (ADC) 196, digital filtering circuit 198, and data formatting module 200. As discussed with reference to FIG. 23, receive analog to digital circuit 108 is operable to receive analog inbound data 124 as a plurality of data streams (RX_1-RX_n in the analog frequency domain) where each stream contains data at a different frequency. ADC 196 converts RX_1-RX_n from the analog frequency domain to RX_1-RX_n in the digital frequency domain (i.e., digital inbound data 202). Each path operates independent of the other paths and can process their respective data streams of digital inbound data 202 at different or same rates depending on how data is split among the data streams and on path processing speeds.

Digital filtering circuit 198 includes "n" digital bandpass filters (BPFs) tuned to extract data at a corresponding frequency RX_1-RX_n. A BPF has a bandpass frequency range and a center frequency (f) where f is set to correspond to a channel where a channel is carrying one of the frequency domain digital inbound data 202 signals (e.g., RX_1). Therefore, each BPF of the "n" BPFs is tuned for a different channel corresponding to desired digital inbound data 202. For example, a first digital BPF is tuned for frequency RX_1, a second digital BPF is tuned for frequency RX_2, and so on. Digital filtering circuit 198 outputs filtered digital data RX_1 data through RX_n data to the data formatting module 200. Data formatting module 200 formats and packetizes the filtered digital data into the received digital data 88.

Figure 25:
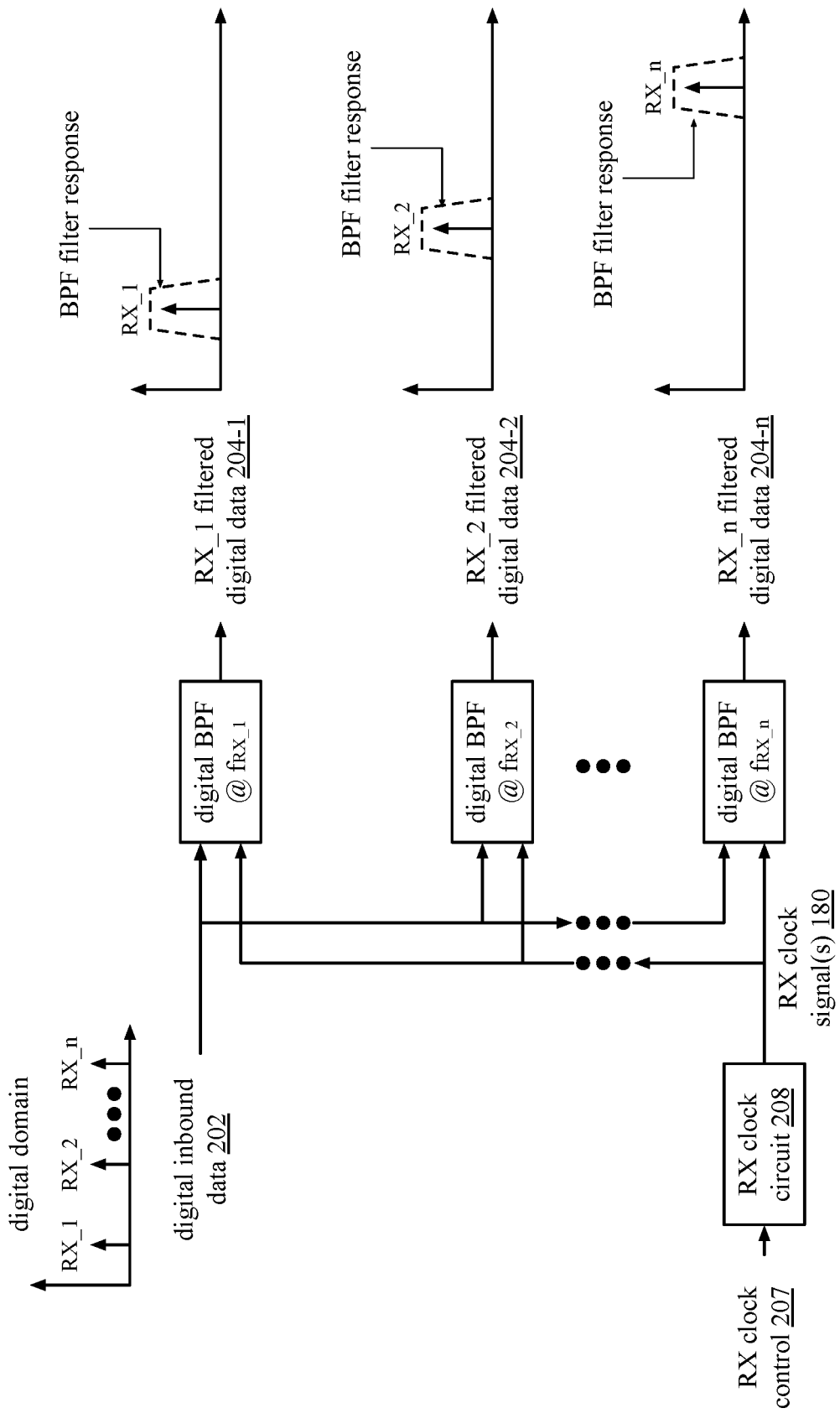
FIG. 25 is a schematic block diagram of another embodiment of the digital filtering circuit in accordance with the present invention.

FIG. 25 is a schematic block diagram of another embodiment of the digital filtering circuit 198 that includes a receive (RX) clock circuit 208 and "n" digital bandpass filters (BPFs). Digital inbound data 202 includes a plurality of digital frequency domain signals RX_1-RX_n. A first digital BPF is tuned to a first frequency (fRX_1) corresponding to a first digital inbound signal (RX_1) to create RX_1 filtered digital data 204-1, a second digital BPF is tuned to a second frequency (fRX_2) corresponding to a second digital inbound signal (RX_2) to create RX_2 filtered digital data 204-2, and an "nth" digital BPF is tuned to an "nth" frequency (fRX_n) corresponding to an "nth" digital inbound signal (RX_n) to create RX_n filtered digital data 204-n.

Because each path through the digital filtering circuit 198 operates independent of the other paths, it is possible for the paths to process their respective data streams of digital inbound data 202 at different rates. RX clock circuit 208, operated by RX control clock 207, generates clock signals (e.g., RX clock signals 180) for digital BPFs 1-n. The digital BPFs 1-n may use the same or different RX clock signal depending on path processing rates. Differing clock rates and compensation of time differences between paths will be discussed in greater detail with reference to FIGS. 26-28.

Figure 26:
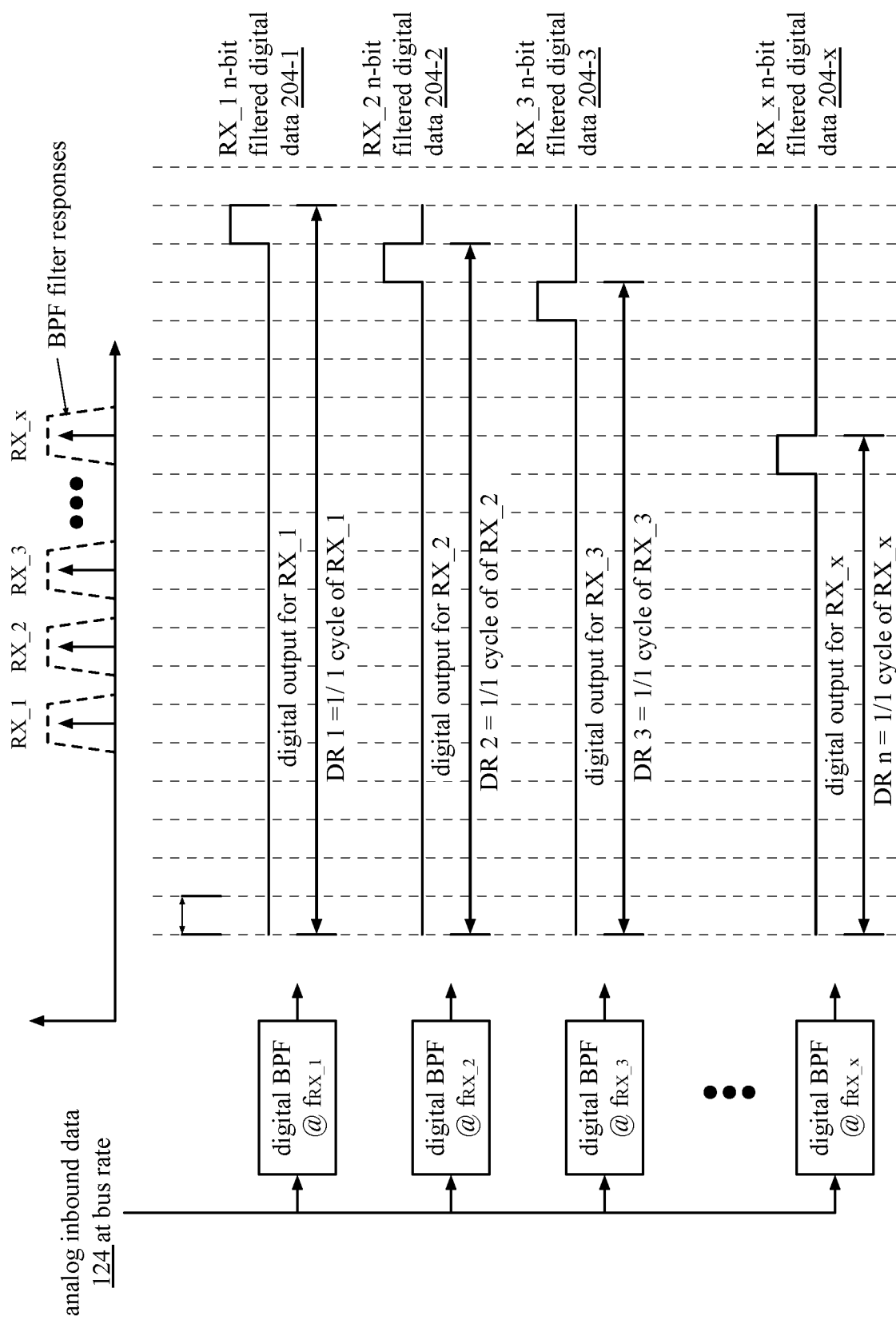
FIG. 26 is a schematic block diagram of another embodiment of the digital filtering circuit in accordance with the present invention.

FIG. 26 is a schematic block diagram of another embodiment of the digital filtering circuit 198 that includes digital bandpass filters (BPFs) that filter data according to different data rates (DR). A first BPF is tuned to fRX_1 for filtering digital inbound data signal RX_1. Digital inbound data signal RX_1 has a data rate (DR) of 1 cycle of RX_1. Thus it takes the first BPF one cycle of RX_1 to produce RX_1 n-bit filtered digital data 204-1. A second BPF is tuned to fRX_2 for filtering digital inbound data signal RX_2.

Digital inbound data signal RX_2 has a data rate (DR) of 1 cycle of RX_2. Thus it takes the second BPF one cycle of RX_2 to produce RX_2 n-bit filtered digital data 204-2. A third BPF is tuned to fRX_3 for filtering digital inbound data signal RX_3. Digital inbound data signal RX_3 has a data rate (DR) of 1 cycle of RX_3. Thus it takes the second BPF one cycle of RX_3 to produce RX_3 n-bit filtered digital data 204-3. An xth BPF is tuned to fRX_x for filtering digital inbound data signal RX_x. Digital inbound data signal RX_x has a data rate (DR) of 1 cycle of RX_x. Thus it takes the xth BPF one cycle of RX_x to produce RX_x n-bit filtered digital data 204-x. As shown, RX_1 has the longest cycle out of the data signals processed. When processing all paths simultaneously, the time differences need to be compensated as will be discussed with reference to FIGS. 27 and 28. For a one-to-one and a one-to-many source-destination, one BPF output can be selected at a time without the need for time compensation.

Figure 27:
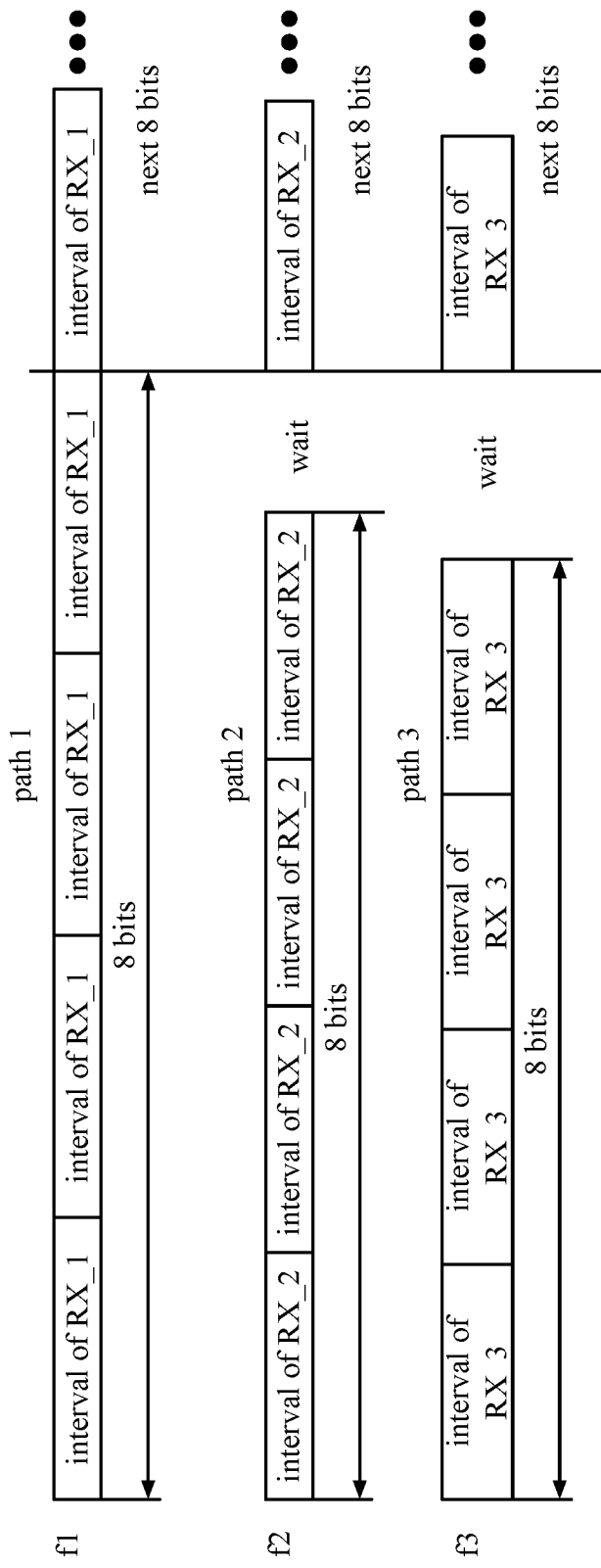
FIG. 27 is an example of compensating time differences of filtered digital data streams in accordance with the present invention.

FIG. 27 is an example of compensating time differences of filtered digital data streams. As discussed with reference to FIGS. 25-26, because each path through the digital filtering circuit 198 can operate independent of other paths and at different rates to process their respective data streams of digital inbound data 202, digital data can be filtered according to different time intervals.

For example, a first path filters data RX_1 and operates in accordance with frequency f1, which is at slightly higher frequency than that of the data rate of a host 1. RX_1 corresponds to a channel and has a data rate corresponding to an interval of that channel's frequency. In this example, it takes the first path one interval of RX_1 to process 2-bits of RX_1 data. A second path filters data RX_2 and operates in accordance with frequency f2, which is at slightly higher frequency than that of frequency f1. In this example, it takes the second path one interval of RX_2 to process 2-bits of RX_2 data. A third path filters RX_3 and operates in accordance with frequency f3, which is at slightly higher frequency than that of frequency f2. In this example, it takes the third path one interval of RX_3 to process 2-bits of RX_3 data.

For example, frequency f1 is at 1.010 GHz, frequency f2 is at 1.020 GHz, and frequency f3 is at 1.030 GHz. As such, the third path will finish recovering data slightly before the other digital BPF circuits. Referring to FIG. 23, the timing difference is compensated for by the buffers on each end such that, as a certain amount of bits (e.g., 24 bits per packet, with 8 bits to three channels) goes into the transmitting LVDC at the rate of the first host device (e.g., f1), the same number of bits will come out of the receiving LVDC at the rate of the host device of the second LVDC. For example, the second and third paths wait until the first path has filtered 8-bits of data before processing another 8-bits. Note that eight bits is a small amount of data per channel per packet. Typically, the amount of data per packet will be more than 24 bits.

Figure 28:
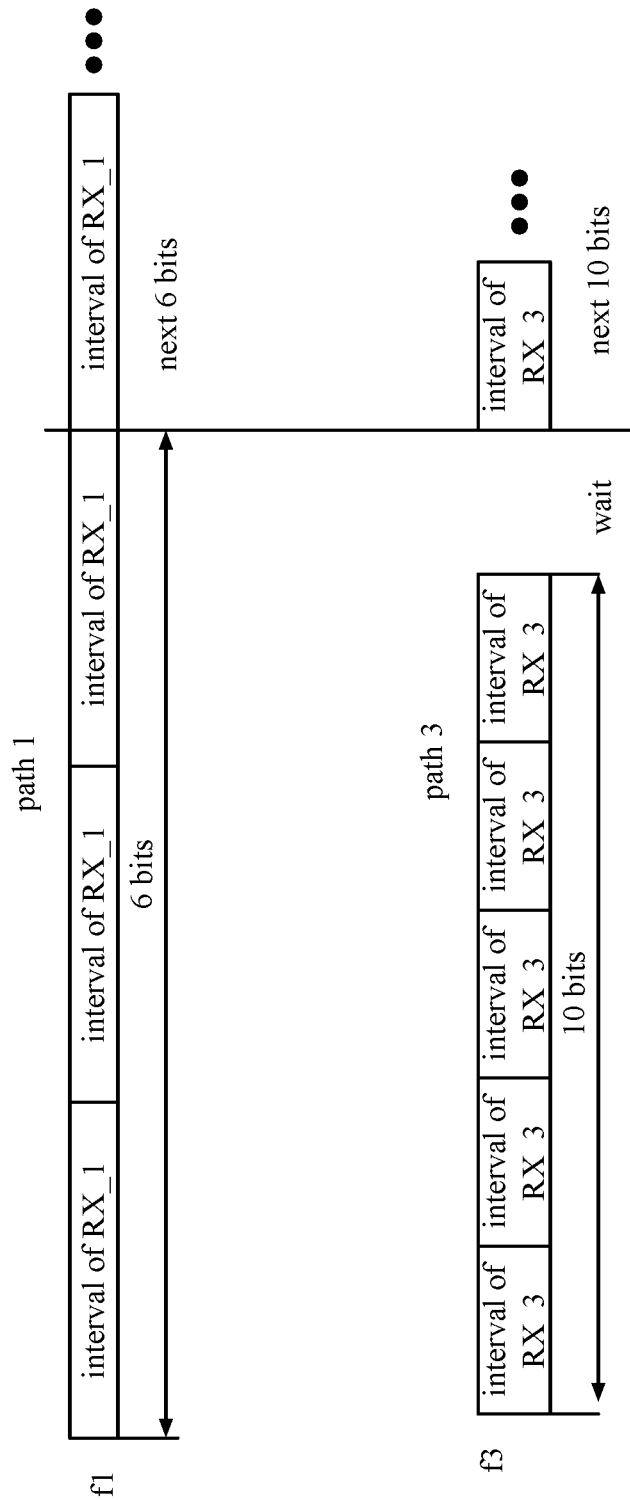
FIG. 28 is another example of compensating time differences of filtered digital data streams in accordance with the present invention.

FIG. 28 is another example of compensating time differences of filtered digital data streams. As discussed with reference to FIGS. 25-26, because each path through the digital filtering circuit 198 can operate independent of other paths and at different rates to process their respective data streams of digital inbound data 202, digital data can be filtered according to different time intervals. For example, a first path filters data RX_1 and operates in accordance with frequency f1, which is at slightly higher frequency than that of the data rate of host 1. RX_1 corresponds to a channel and has a data rate corresponding to an interval of that channel's frequency. In this example, it takes the first path one interval of RX_1 to process 2-bits of RX_1 data. A third path filters RX_3 and operates in accordance with frequency f3, which is at a higher frequency than that of frequency f1. In this example, it takes the third path one interval of RX_3 to process 2-bits of RX_3 data.

As shown, path 3 can complete 5 cycles (recover 10-bits) of data for every 3 cycles of path 1 (6-bits recovered). Instead of having path 3 wait for path 1 to recover 8-bits as discussed in FIG. 27, the timing difference is compensated for by the buffers on each end such that, as 6-bits goes into the transmitting LVDC at the rate of the first host device (e.g., f1) and 10-bits goes into the transmitting LVDC at the rate of the third host device (e.g., f3) the same the same number of bits will come out of the receiving LVDC at the rate of the host device of the second LVDC. For example, the third path processes 10-bits then waits until the first path has processed 6-bits of data before processing another 10-bits. Again, note that 16 bits per packet is a small amount of data per packet and in practice there will likely be more than 16 bits per packet, or data field per packet.

Figure 29:
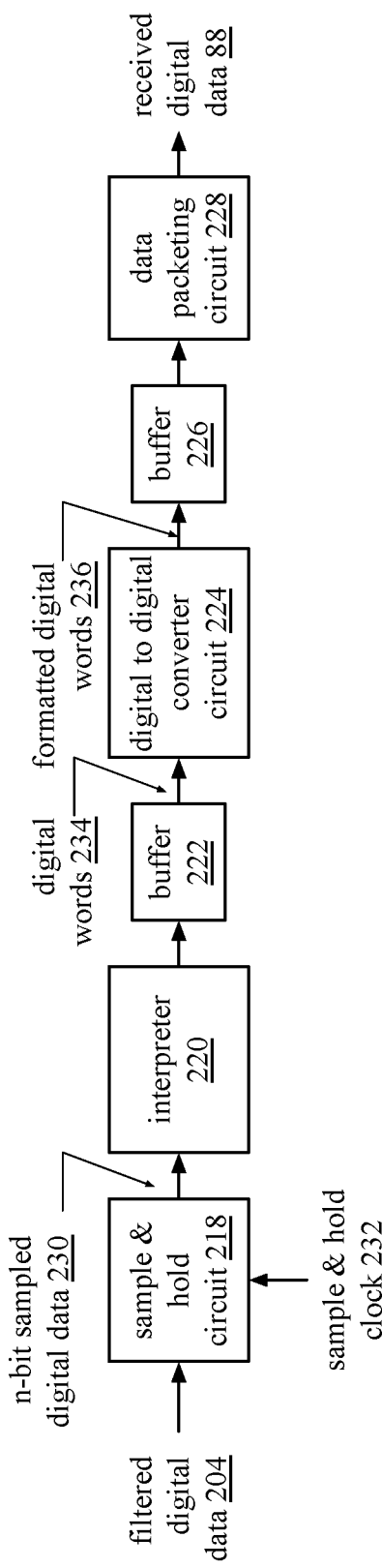
FIG. 29 is a schematic block diagram of an embodiment of a data formatting module in accordance with the present invention.

FIG. 29 is a schematic block diagram of an embodiment of a data formatting module 200 that includes sample & hold circuit 218, interpreter 220, buffer 222, digital to digital converter circuit 224, buffer 226, and data packeting circuit 228. Data formatting module 200 formats and packetizes filtered digital data 204 in accordance with one or more receive parameters to produce received digital data 88.

Sample & hold circuit 218 samples and holds an "n"-bit digital value data of filtered digital data 204 (e.g., a pulse representative of 1-bit, 2-bit, etc., of data) received every data clock cycle from digital filtering circuit 198 at a sample & hold clock 232 rate to produce an n-bit sampled digital data 230 value. Interpreter 220 interprets the n-bit sampled digital data 230. For example, interpreter 220 converts n-bit sampled digital data 230 to a binary string. Interpreter 220 writes interpreted n-bit sampled digital data into buffer 222 operating according to a write rate/read rate clock cycle until a digital word 234 is formed (e.g., 8-bits of data, 16-bits of data, etc.). Buffer 222 outputs digital words 234 to digital to digital converter circuit 224 for further formatting.

Digital to digital converter circuit 224 formats digital words 234 to formatted digital words 236 and writes formatted digital words 236 to buffer 226. Data packeting circuit 228 creates data packets from formatted digital words 236 and outputs data packets as received digital data 88.

Figure 30:
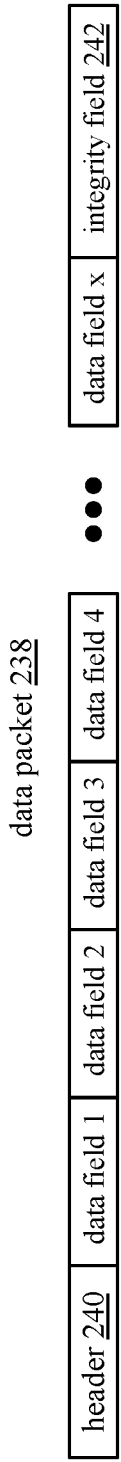
FIG. 30 is an example of received digital data formatted as a data packet in accordance with the present invention.

FIG. 30 is an example of received digital data 88 formatted as a data packet 238. Data packet 238 includes a header 240, data fields 1-x, and integrity field 242. Header 240 includes information about the data carried by packet 238. For example, header 240 information includes packet length, synchronization, packet number, protocol, and/or addressing information. Data fields 1-x contain one or more digital words of any specified byte size (e.g., 64 bytes). Integrity field 242 includes error checking such as a Cyclic Redundancy Check (CRC), checksum, hash of the packet. If an error is detected via integrity field 242, the packet may be resent (i.e., feedback error correction) or an error-correcting code is used to correct certain errors (i.e., feed forward error correction such as Reed Solomon, etc.).

FIG. 31 is a schematic block diagram of an embodiment of a portion of a data formatting module 200 that includes sample & hold circuit 218, interpreter 220, and buffer 222. Sample & hold circuit 218 samples and holds an n-bit digital value data of filtered digital data 204 (e.g., a pulse representative of 1-bit, 2-bit, etc., of data) received every data clock cycle from digital filtering circuit 198 at a sample & hold clock 232 rate to produce an n-bit sampled digital data 230 value. Interpreter 220 interprets the n-bit sampled digital data 230. For example, interpreter 220 converts n-bit sampled digital data 230 to a binary string. Interpreter 220 writes interpreted n-bit sampled digital data into buffer 222 operating according to a write clock 244 cycle until a digital word 234 is formed (e.g., 8-bits of data, 16-bits of data, etc.).

FIG. 32 is an example of clock signals of the portion of formatting module 200 of FIG. 31. Sample & hold circuit 218 samples and holds an n-bit digital value data of filtered digital data 204 (e.g., a pulse representative of 1-bit, 2-bit, etc., of data) received every n-bit data clock 212 cycle. Filter clock 214 (e.g., of digital BPF 206) operates at "x" (e.g., where "x" is the number of filter taps) times the n-bit data clock 212. At the end of the data clock 212 cycle (e.g., after x cycles of the filter clock 214), the filter output 216 (e.g., a pulse representative of the input data (e.g., logic 1 or 0 for 1-bit or logic 00, 01, 10, or 11 for 2-bit based on magnitude, phase, and/or frequency, etc.)) is output as filtered digital data 204 to sample & hold circuit 218.

Sample & hold clock 232 is set to capture/sample the filtered digital data 204 on the rising edge of every filter output 216 for a certain time (e.g., ½ filter cycle) and hold for a certain time (e.g., ½ filter cycle). Sample & hold circuit 218 outputs n-bit sampled digital data 230 to interpreter 220 as discussed with reference to FIG. 31. Interpreter 220 writes interpreted n-bit sampled digital data (e.g., a plurality of n-bit digital values on an-bit digital value by n-bit digital value basis) into buffer 222, where buffer 222 stores the plurality of n-bit digital values on an n-bit digital value by n-bit digital value basis in accordance with a write clock operating according to a write clock cycle 244 until a digital word 234 is formed (e.g., 8-bits of data, 16-bits of data, etc.).

Figure 33:
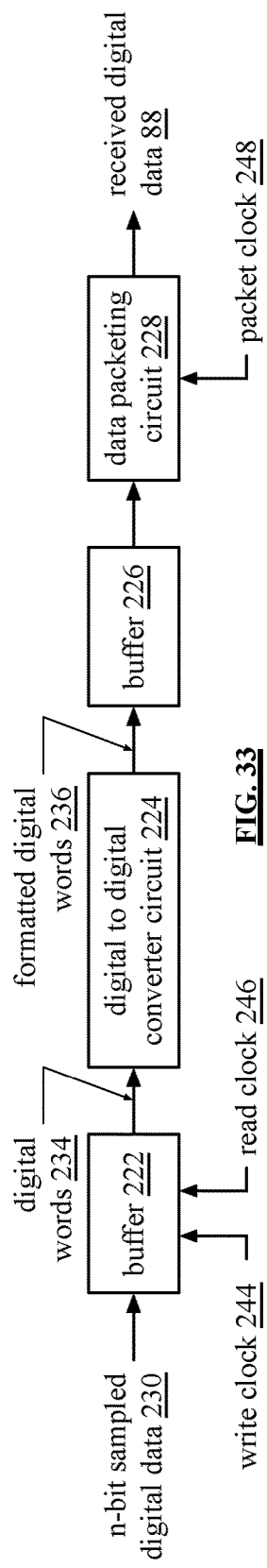
FIG. 33 is a schematic block diagram of an embodiment of a portion of a data formatting module in accordance with the present invention.

FIG. 33 is a schematic block diagram of an embodiment of a portion of a data formatting module 200 that includes buffer 222, digital to digital converter circuit 224, buffer 226 (i.e., a second buffer 226), and data packeting circuit 228. Interpreter 220 writes interpreted n-bit sampled digital data into buffer 222 operating according to a write clock 244 until a digital word 234 is formed. Buffer 222 outputs digital words 234 according to a read clock 246 to digital to digital converter circuit 224 for further formatting. Digital to digital converter circuit 224 formats digital words 234 to formatted digital words 236 and writes formatted digital words 236 to buffer 226 (i.e., the second buffer 226). Data packeting circuit 228 creates data packets at a packet clock 248 rate from formatted digital words 236 and outputs data packets as received digital data 88.

Figure 34:
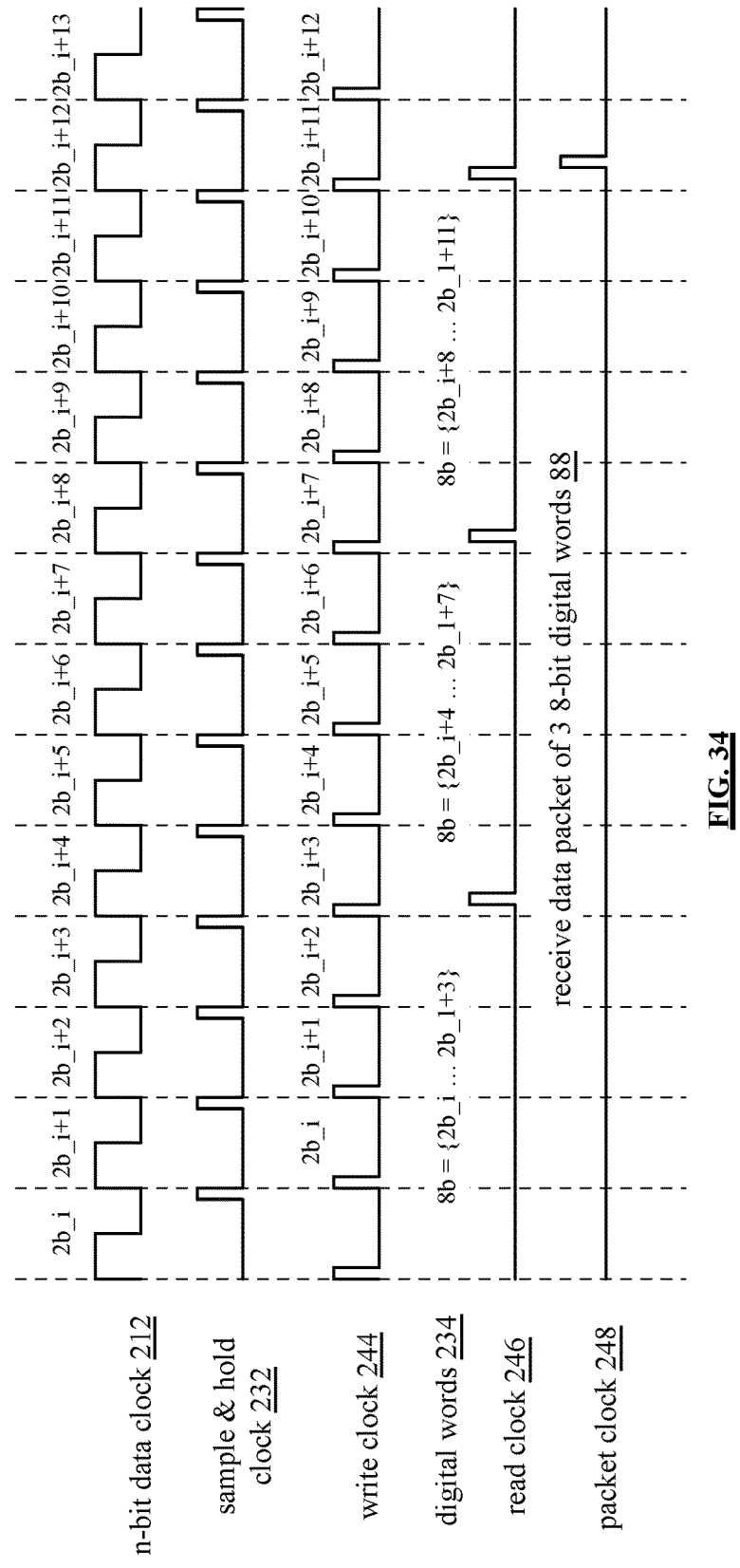
FIG. 34 is an example of clock signals of the portion of formatting module of FIG. 33 in accordance with the present invention.

FIG. 34 is an example of clock signals of the portion of formatting module 200 of FIG. 33. In this example, "n" is equal to 2, a digital word 234 is 8-bits, and a packet includes 3 digital words. Sample & hold clock 232 is set to capture/sample the filtered digital data 204 on the rising edge of every filter output 216 for a certain time (e.g., ½ filter cycle) and hold for a certain time (e.g., ½ filter cycle). At the end of the data clock 212 cycle (e.g., after x cycles of the filter clock 214, where the filter has x taps), the filter output 216 (e.g., a pulse representative of the input data (e.g., logic 00, 01, 10, or 11 for 2-bit based on magnitude, phase, and/or frequency, etc.)) is output as filtered digital data 204 to sample & hold circuit 218.

Interpreter 220 writes interpreted n-bit sampled digital data into buffer 222, where buffer 222 stores a plurality of interpreted n-bit digital values on an n-bit digital value by n-bit digital value basis in accordance with a write clock operating according to a write clock cycle 244 until a digital word 234 is formed (e.g., 8-bits of data). Buffer 222 outputs digital words 234 according to read clock 246. Write clock 244 is set to capture data during the hold of sample & hold clock 232. As shown, it takes four write clock 244 cycles (plus one initial cycle) to form an 8-bit digital word 234. As such, read clock 246 is set to output data every 4 write clock cycles (plus one additional initial write cycle). Buffer 226 outputs formatted digital words 236 from digital to digital converter circuit 224 to data packeting circuit 228 in accordance with packet clock 248. Packet clock 248 cycle is set to capture data after three read clock 246 cycles because in this example, a packet consists of 3 8-bit digital words in this example.

Figure 35:
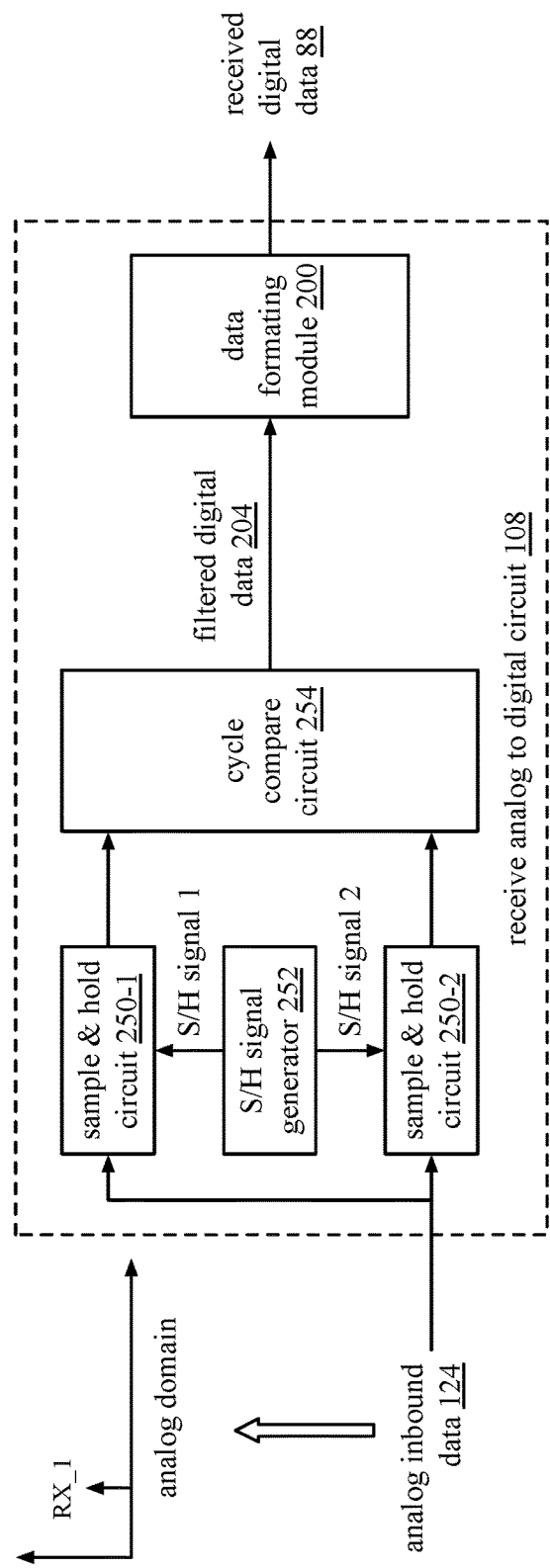
FIG. 35 is a schematic block diagram of another embodiment of a receive analog to digital circuit in accordance with the present invention.

FIG. 35 is a schematic block diagram of another embodiment of a receive analog to digital circuit 108 that includes sample & hold circuits 250-1 and 250-2, sample & hold (S/H) signal generator 252, cycle compare circuit 254, and data formatting module 200. Instead of processing analog inbound data 124 through an analog to digital converter 196 and digital filtering circuit 198 as in FIG. 17, for single channel use, analog inbound data 124 (i.e., a sinusoidal signal represented as tone RX_1 in the analog frequency domain) is input into sample & hold circuits 250-1 and 250-2. Sample & hold circuit 250-1 samples (e.g., measures one or more samples) and holds analog inbound data 124 according to S/H signal 1, where S/H 1 is created by S/H signal generator 252. S/H signal 1 is generated to sample and hold analog inbound data 124 at a first peak of a cycle of analog inbound data 124 (e.g., at 90°). Sample & hold circuit 250-2 samples (e.g., measures one or more samples) and holds analog inbound data 124 according to S/H signal 2 created by S/H signal generator 252. S/H signal 2 is generated to sample and hold analog inbound data 124 at a second peak (e.g., at 270°) of the cycle of analog inbound data 124.

Data collected by sample & hold circuits 250-1 and 250-2 is input into cycle compare circuit 254. Cycle compare circuit 254 compares the data from sample & hold circuits 250-1 and 250-2 to detect amplitude shift keying (ASK), phase shift keying (PSK), and/or another type of encoding. For example, the absolute value of the amplitude of a sinusoidal signal at 90° and at 270° are equal and opposite. If the data from sample & hold circuits 250-1 and 250-2 are equal and opposite, cycle comparator circuit 254 recognizes the inputs as data to be collected. If the data from sample & hold circuits 250-1 and 250-2 are not equal and opposite, then data is not collected.

When cycle compare circuit 254 recognizes data to be collected, the data is analyzed according to amplitude shift keying (ASK), phase shift keying (PSK), and/or another corresponding type of encoding. For example, the data from sample & hold circuits 250-1 and 250-2 indicates an analog inbound data 124 cycle with equal and opposite peaks (e.g., 0.5 V from sample & hold circuits 250-1, and −0.5 V from sample & hold circuits 250-2). Cycle compare circuit 254 interprets the absolute value of the 0.5 V amplitude as a pulse representative of an n-bit digital logic value (e.g., logic 1 or 0 for 1-bit) and outputs that pulse as filtered digital data 204. Filtered digital data 204 is input to data formatting module 200 where it is formatted as discussed with reference to FIGS. 29-34.

Figure 36:
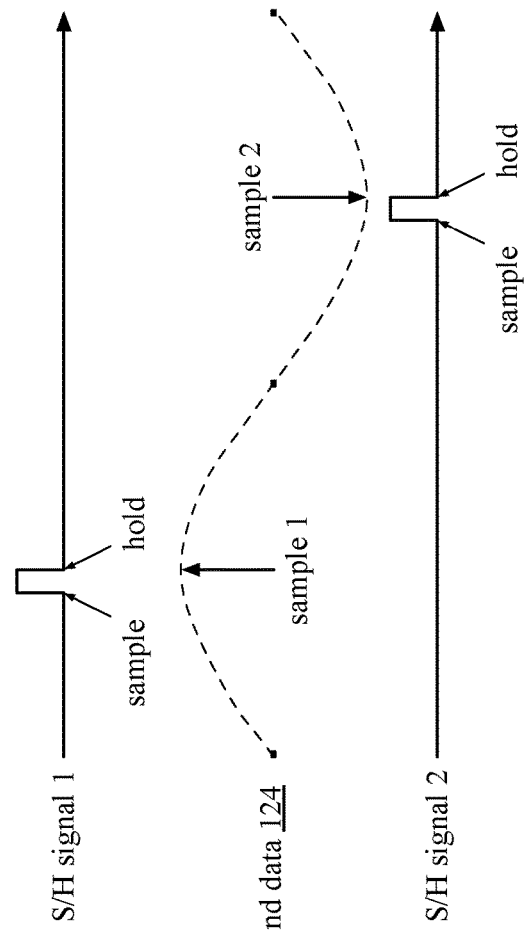
FIG. 36 is an example of sample & hold (S/H) signals of FIG. 35 in accordance with the present invention.

FIG. 36 is an example of sample & hold (S/H) signals of FIG. 35. Sample & hold circuit 250-1 samples and holds analog inbound data 124 according to S/H signal 1 created by S/H signal generator 252. S/H signal 1 is generated to sample (e.g., one or more samples) and hold analog inbound data 124 at a first peak of a cycle of analog inbound data 124 (e.g., at 90°). As shown, the sample period of S/H signal 1 begins before a first peak of analog inbound data 124 and the hold period of S/H signal 1 begins at the maximum point of the peak (e.g., 90°) in order to capture the maximum point. Sample & hold circuit 250-2 samples (e.g., one or more samples) and holds analog inbound data 124 according to S/H signal 2 created by S/H signal generator 252. S/H signal 2 is generated to sample and hold analog inbound data 124 at a second peak (e.g., at 270°) of the cycle of analog inbound data 124. As shown, the sample period of S/H signal 2 begins before a second peak of analog inbound data 124 and the hold period of S/H signal 2 begins at the maximum point of the peak (e.g., 270°) in order to capture the maximum point.

FIG. 37 is a schematic block diagram of an embodiment of a cycle compare circuit 254 that has been calibrated for amplitude shift keying (ASK) encoding. Cycle compare circuit 254 includes compare magnitudes 256, equal 258, and compare magnitudes 260. In an example of operation, compare magnitudes 256 compares sample 1 and sample 2 (e.g., from sample & hold circuits 250-1 and 250-2 of FIG. 35). For example, compare magnitudes 256 adds sample 1 and sample 2 together and outputs the result to equal 258. Equal 258 determines whether the sum generated by compare magnitudes 256 represents equal magnitudes or is alternatively not data.

For example, the peaks of one cycle of a sinusoidal signal have amplitudes substantially equal and opposite to one another (i.e., equal magnitudes). Thus, the sum of sample 1 and 2 of one cycle of a sinusoid should be zero. When the sum is zero, equal 258 indicates that the compare magnitudes 260 should determine the digital logic value corresponding to the magnitude of samples 1 and 2. When the sum is not zero, equal 258 determines that the samples received do not represent data of interest.

Compare magnitudes 260 is calibrated to receive a magnitude, determine whether the magnitude represents digital logic "0" or digital logic "1" (e.g., in a 1-bit example) and output a pulse representative of the digital logic value as filtered digital data 204. For example, a cycle of inbound analog data having a magnitude of 0.5 V corresponds to a digital logic value "0" and a cycle of inbound analog data having a magnitude of 1 V corresponds to a digital logic value "1." While this example covers 2 samples per cycle, more levels can be added for greater samples per cycle.

FIG. 38 is a schematic block diagram of another embodiment of a cycle compare circuit 254 that has been calibrated for phase shift keying (PSK) encoding. Cycle compare circuit 254 includes compare magnitudes 256, equal 258, and compare phase shifts 262. In an example of operation, compare magnitudes 256 compares sample 1 and sample 2 (e.g., from sample & hold circuits 250-1 and 250-2 of FIG. 35). For example, compare magnitudes 256 adds sample 1 and sample 2 together and outputs the result to equal 258. Equal 258 determines whether the sum generated by compare magnitudes 256 represents equal magnitudes or is alternatively not data.

For example, the peaks of one cycle of a sinusoidal signal have amplitudes substantially equal and opposite to one another (i.e., equal magnitudes). Thus, the sum of amplitudes from sample 1 and 2 of one cycle of a sinusoid should be zero. When the sum is zero, equal 258 indicates that compare phase shifts 262 should determine the digital logic value corresponding to the phase shift of samples 1 and 2. When the sum is not zero, equal 258 determines that the samples received do not represent data of interest.

Compare phase shifts 262 is calibrated to receive a phase shift, determine whether the phase shift represents digital logic "0" or digital logic "1" (e.g., in a 1-bit example) and output a pulse representative of the digital logic value as filtered digital data 204. For example, a cycle of inbound analog data having a phase shift of 0° corresponds to a digital logic value "0" and a cycle of inbound analog data having a phase shift of 180° corresponds to a digital logic value "1." While this example covers 2 samples per cycle, more levels can be added for greater samples per cycle and combinations of the shown circuitry. Further, a combination of the circuitry shown in FIGS. 37 and 38 can be combined for a 2-bit filtered digital data 204 output.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provide an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method comprising:
receiving, by a drive sense circuit of a low voltage drive circuit (LVDC), an analog receive signal from a bus;
converting, by the drive sense circuit, the analog receive signal into analog inbound data;
converting, by an analog to digital converter of a receive analog to digital circuit of the LVDC, the analog inbound data into digital inbound data;
filtering, by a digital filtering circuit of the receive analog to digital circuit, the digital inbound data to produce filtered digital data;
sampling and holding, by a sample and hold circuit of a data formatting module of the receive analog to digital circuit, an n-bit digital value of the filtered digital data to produce an n-bit sampled digital data value;

adjusting, by a digital to digital converter circuit of the data formatting module, formatting of the n-bit sampled digital data value to produce a formatted digital value; and generating, by a data packeting circuit of the data formatting module, a packet of received digital data from a plurality of formatted digital values, wherein the plurality of formatted digital values includes the formatted digital value.

2. The method of claim 1 further comprising:

receiving, by an interpreter of the data formatting module, a plurality of n-bit sampled digital data values from the sample and hold circuit;

converting, by the interpreter, the plurality of n-bit sampled digital data values into a plurality of interpreted n-bit sampled digital data values; and outputting, by the interpreter, the plurality of interpreted n-bit sampled digital data values to the digital to digital converter circuit on an interpreted n-bit sampled digital data value by interpreted n-bit sampled digital data value basis in accordance with a write clock.

3. The method of claim 2, wherein the converting the plurality of n-bit sampled digital data values into the plurality of interpreted n-bit sampled digital data values is based on n-bit to binary data conversion.

4. The method of claim 1 further comprising:

receiving, by an interpreter of the data formatting module, a plurality of n-bit sampled digital data values from the sample and hold circuit;

converting, by the interpreter, the plurality of n-bit sampled digital data values into a plurality of interpreted n-bit sampled digital data values; and outputting, by the interpreter, the plurality of interpreted n-bit sampled digital data values to a buffer of the data formatting module on an interpreted n-bit sampled digital data value by interpreted n-bit sampled digital data value basis in accordance with a write clock.

5. The method of claim 4 further p comprising:

outputting, by the buffer, a plurality of digital words on a digital word by digital word basis in accordance with a read clock to the digital to digital converter circuit, wherein a digital word of the plurality of digital words includes a set of n-bit sampled digital data values of the plurality of n-bit sampled digital data values.

6. The method of claim 5 further comprising:

generating, by the digital to digital converter circuit, a plurality of formatted digital words from the plurality of digital words.

7. The method of claim 6 further comprising:

storing, by a second buffer of the data formatting module, the plurality of formatted digital words on a formatted digital word by formatted digital word basis in accordance with the read clock of the buffer to produce a plurality of buffered digital words; and outputting, by the second buffer, the plurality of buffered digital words to the data packeting circuit on a buffered digital word by buffered digital word basis in accordance with a second read packet clock.

8. The method of claim 7 further comprising:

generating, by the data packeting circuit, the packet to include a set of buffered digital words of the plurality of buffered digital words in accordance with the packet clock.

* * * * *